US010032569B2

(12) United States Patent
Rubloff et al.

(10) Patent No.: US 10,032,569 B2
(45) Date of Patent: *Jul. 24, 2018

(54) NANODEVICE ARRAYS FOR ELECTRICAL ENERGY STORAGE, CAPTURE AND MANAGEMENT AND METHOD FOR THEIR FORMATION

(71) Applicant: UNIVERSITY OF MARYLAND, College Park, MD (US)

(72) Inventors: Gary W. Rubloff, Clarksville, MD (US); Sang Bok Lee, Clarksville, MD (US); Israel Perez, Dana Point, CA (US); Laurent Lecordier, Silver Spring, MD (US); Parag Banerjee, Greenbelt, MD (US); Chanyuan Liu, Greenbelt, MD (US); Xinyi Chen, Tualatin, OR (US); Eleanor Gillette, Columbia, SC (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/570,921

(22) Filed: Dec. 15, 2014

(65) Prior Publication Data

US 2015/0200058 A1    Jul. 16, 2015

Related U.S. Application Data

(63) Continuation-in-part of application No. 12/869,215, filed on Aug. 26, 2010, now Pat. No. 8,912,522.

(Continued)

(51) Int. Cl.
*H01L 21/00* (2006.01)
*H01G 11/26* (2013.01)

(Continued)

(52) U.S. Cl.
CPC .............. *H01G 11/26* (2013.01); *B82Y 10/00* (2013.01); *B82Y 30/00* (2013.01); *H01G 4/005* (2013.01);

(Continued)

(58) Field of Classification Search
CPC .... H01G 11/26; H01L 28/90; H01L 31/02008
See application file for complete search history.

(56) References Cited

U.S. PATENT DOCUMENTS 5,866,444 A * 2/1999 Yamazaki ........... H01L 21/4846
257/E21.582
6,075,691 A * 6/2000 Duenas ............. H01L 21/31687
257/E21.008

(Continued)

FOREIGN PATENT DOCUMENTS

WO    WO 2009042218 A1 *  4/2009  ............. H01G 4/008

OTHER PUBLICATIONS

Ran Liu and Sang Bok Lee, "Mn02/Poly(3,4-ethylenedioxythiophene) Coaxial Nanowires by One-Step Coelectrodeposition for Electrochemical Energy Storage", JACS Communications, Published on Web Feb. 15, 2008, Department of Chemistry and Biochemistry, University of Maryland, College Park, Maryland 20742, 10 pages.

*Primary Examiner* — Laura Menz

(74) *Attorney, Agent, or Firm* — Squire Patton Boggs (US) LLP

(57) ABSTRACT

An apparatus, system, and method are provided for a vertical two-terminal nanotube or microtube device configured to capture and generate energy, to store electrical energy, and to integrate these functions with power management circuitry. The vertical device can include a column disposed in a template material extending from one side of the template material to the other side of the template material. Further, the device can include a first material disposed within the (Continued)

column, a second material disposed within the column, and a third material disposed in the column. A variety of configurations, variations, and modifications are provided.

7 Claims, 15 Drawing Sheets

Related U.S. Application Data

(60) Provisional application No. 61/237,155, filed on Aug. 26, 2009, provisional application No. 62/001,995, filed on May 22, 2014.

(51) Int. Cl.

| | | |
|---|---|---|
| H01G 11/30 | (2013.01) | |
| H01G 11/56 | (2013.01) | |
| H01G 11/58 | (2013.01) | |
| H01G 4/008 | (2006.01) | |
| H01G 4/005 | (2006.01) | |
| H01M 2/02 | (2006.01) | |
| H01M 10/056 | (2010.01) | |
| H01M 10/36 | (2010.01) | |
| H01M 6/04 | (2006.01) | |
| H01M 6/18 | (2006.01) | |
| B82Y 10/00 | (2011.01) | |
| B82Y 30/00 | (2011.01) | |
| H01G 11/36 | (2013.01) | |
| H01G 11/86 | (2013.01) | |
| H01L 31/0352 | (2006.01) | |
| H01L 31/02 | (2006.01) | |
| H01L 31/068 | (2012.01) | |
| H01L 31/07 | (2012.01) | |
| H01L 49/02 | (2006.01) | |
| H01L 29/872 | (2006.01) | |
| H01L 29/06 | (2006.01) | |
| B82Y 20/00 | (2011.01) | |

(52) U.S. Cl.
CPC ............ *H01G 4/008* (2013.01); *H01G 11/30* (2013.01); *H01G 11/36* (2013.01); *H01G 11/56* (2013.01); *H01G 11/58* (2013.01); *H01G 11/86* (2013.01); *H01L 28/90* (2013.01); *H01L 29/0676* (2013.01); *H01L 31/02008* (2013.01); *H01L 31/03529* (2013.01); *H01L 31/035227* (2013.01); *H01L 31/068* (2013.01); *H01L 31/07* (2013.01); *H01M 2/0257* (2013.01); *H01M 6/04* (2013.01); *H01M 6/18* (2013.01); *H01M 10/056* (2013.01); *H01M 10/36* (2013.01); *B82Y 20/00* (2013.01); *H01L 29/0665* (2013.01); *H01L 29/872* (2013.01); *H01M 2002/0297* (2013.01); *Y02E 10/547* (2013.01); *Y02E 60/13* (2013.01); *Y10S 977/742* (2013.01)

(56) References Cited

U.S. PATENT DOCUMENTS

| | | | | |
|---|---|---|---|---|
| 6,320,244 B1* | 11/2001 | Alers | .................. | H01L 27/1085 257/532 |
| 6,323,084 B1* | 11/2001 | Hyun | ................ | H01L 27/10852 257/E21.013 |
| 6,329,234 B1* | 12/2001 | Ma | ......................... | H01L 28/40 257/301 |
| 6,341,056 B1* | 1/2002 | Allman | .................... | H01G 4/20 257/295 |
| 6,344,413 B1* | 2/2002 | Zurcher | ............. | H01L 21/3212 257/E21.009 |
| 6,352,893 B1* | 3/2002 | Michaelis | ............. | C25D 11/32 257/E21.288 |
| 6,373,087 B1* | 4/2002 | Harris | ..................... | H01L 28/75 257/301 |
| 6,461,528 B1* | 10/2002 | Scherer | ................. | B01L 3/5082 210/490 |
| 6,891,191 B2* | 5/2005 | Xiao | .................... | H01L 51/0575 257/40 |
| 6,992,344 B2* | 1/2006 | Coolbaugh | ....... | H01L 21/76807 257/301 |
| 7,045,205 B1* | 5/2006 | Sager | ..................... | B82Y 10/00 136/244 |
| 7,229,909 B2* | 6/2007 | Furukawa | ............. | B82Y 10/00 257/E21.581 |
| 7,576,410 B2* | 8/2009 | Rueb | ..................... | B82Y 10/00 257/401 |
| 7,898,658 B2* | 3/2011 | Moskovits | ........... | G01N 21/658 356/301 |
| 7,932,549 B2* | 4/2011 | Holmes | ................. | B82Y 10/00 257/296 |
| 8,378,333 B2* | 2/2013 | Banerjee | ............... | H01G 4/008 257/14 |
| 8,912,522 B2* | 12/2014 | Rubloff | ................. | B82Y 10/00 257/14 |
| 2001/0023986 A1* | 9/2001 | Mancevski | ........... | G01Q 70/12 257/741 |
| 2002/0176989 A1* | 11/2002 | Knudsen | ................ | H01G 4/206 428/408 |
| 2003/0139017 A1* | 7/2003 | Park | .................. | H01L 27/10855 438/396 |
| 2004/0113235 A1* | 6/2004 | Coolbaugh | ....... | H01L 21/76807 257/532 |
| 2004/0262636 A1* | 12/2004 | Yang | ...................... | B82Y 10/00 257/200 |
| 2005/0032297 A1* | 2/2005 | Kamins | ............... | H01L 29/0673 438/232 |
| 2005/0116336 A1* | 6/2005 | Chopra | .................. | B82Y 10/00 257/720 |
| 2005/0121068 A1* | 6/2005 | Sager | .................. | H01L 51/4213 136/252 |
| 2005/0161662 A1* | 7/2005 | Majumdar | ............. | B82Y 10/00 257/18 |
| 2005/0274992 A1* | 12/2005 | Appenzeller | .......... | B82Y 10/00 257/288 |
| 2006/0165586 A1* | 7/2006 | Wong | ..................... | B82Y 30/00 423/447.1 |
| 2007/0134555 A1* | 6/2007 | Ren | ........................ | B82Y 10/00 429/245 |
| 2007/0275487 A1* | 11/2007 | Lee | ..................... | B81C 1/00142 438/22 |
| 2008/0132055 A1* | 6/2008 | Nguyen | ............ | H01L 21/02126 438/618 |
| 2008/0179590 A1* | 7/2008 | Mancevski | ............. | B82Y 10/00 257/40 |
| 2008/0277646 A1* | 11/2008 | Kim | ....................... | B82Y 10/00 257/14 |
| 2009/0014767 A1* | 1/2009 | Furukawa | .............. | B82Y 10/00 257/301 |
| 2009/0108252 A1* | 4/2009 | Banerjee | ................. | H01G 4/008 257/14 |
| 2009/0229989 A1* | 9/2009 | Urgen | ...................... | B82Y 30/00 205/150 |
| 2010/0139772 A1* | 6/2010 | Frank | .................... | H01G 9/2031 136/261 |
| 2010/0173478 A1* | 7/2010 | Tombler | ................ | B82Y 10/00 438/478 |
| 2010/0219079 A1* | 9/2010 | Routkevitch | ........ | B01D 53/228 205/175 |
| 2010/0304204 A1* | 12/2010 | Routkevitch | ........... | C01B 3/042 429/122 |
| 2010/0314682 A1* | 12/2010 | Yilmaz | .................. | H01L 29/0661 257/328 |
| 2011/0073827 A1* | 3/2011 | Rubloff | .................. | B82Y 10/00 257/3 |

(56) References Cited

U.S. PATENT DOCUMENTS

| | | | | |
|---|---|---|---|---|
| 2011/0086507 A1* | 4/2011 | Soussan | H01L 21/02238 | 438/637 |
| 2011/0132002 A1* | 6/2011 | Lee | B82Y 10/00 | 62/3.7 |
| 2012/0153454 A1* | 6/2012 | Liu | H01L 23/38 | 257/712 |
| 2012/0325669 A1* | 12/2012 | Kim | C07K 14/31 | 205/109 |
| 2013/0270121 A1* | 10/2013 | Liao | C25D 1/04 | 205/76 |
| 2013/0342963 A1* | 12/2013 | Besesty | H01G 11/10 | 361/502 |
| 2015/0005176 A1* | 1/2015 | Kim | C12Q 1/6872 | 506/2 |
| 2015/0200058 A1* | 7/2015 | Rubloff | H01G 11/26 | 429/163 |
| 2015/0212382 A1* | 7/2015 | Miyazaki | G02F 1/155 | 348/294 |
| 2016/0001232 A1* | 1/2016 | Bond | B01D 67/0062 | 29/623.5 |
| 2016/0068266 A1* | 3/2016 | Carroll | B64C 11/20 | 244/53 R |

* cited by examiner

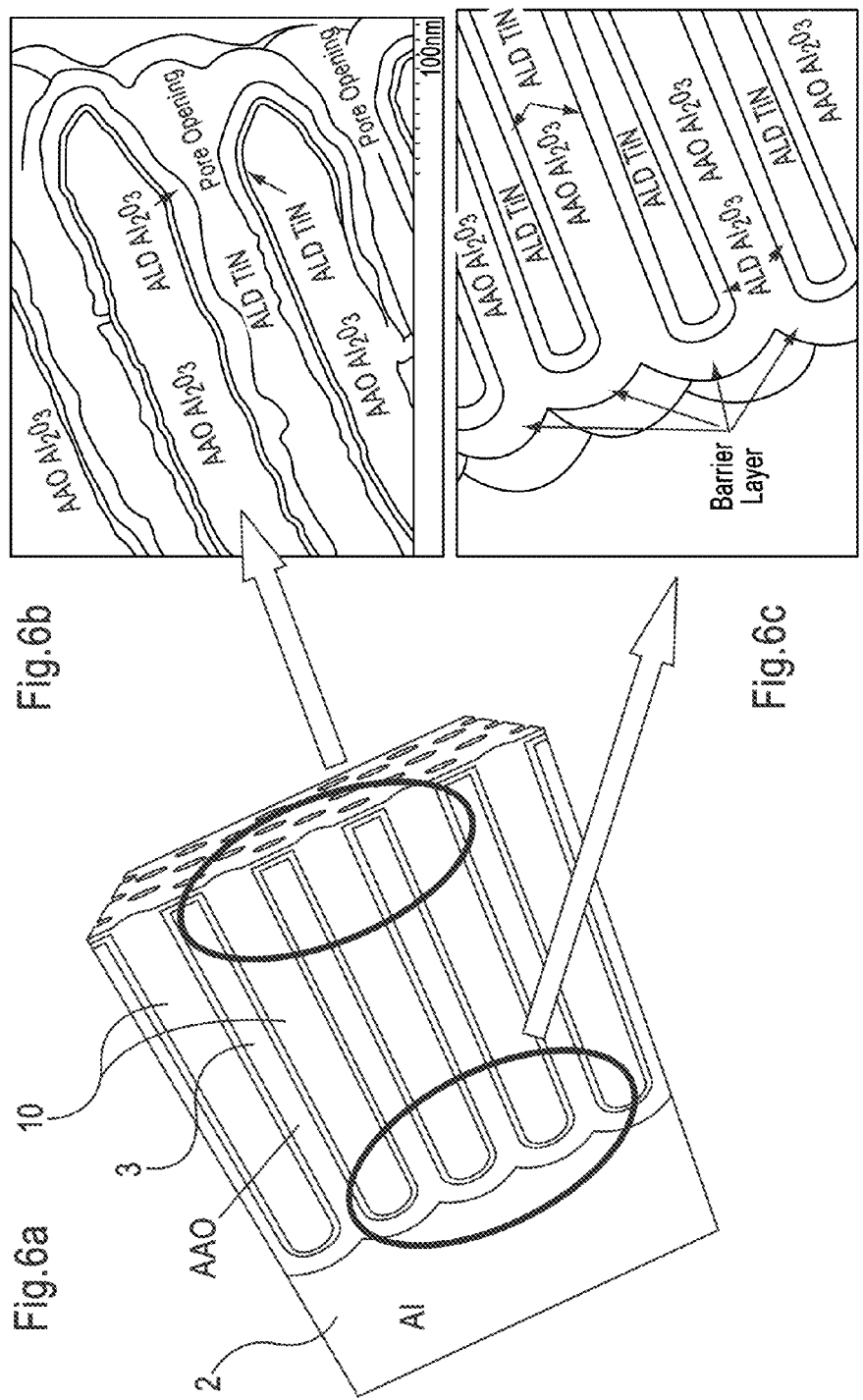

NANODEVICE ARRAYS FOR ELECTRICAL ENERGY STORAGE, CAPTURE AND MANAGEMENT AND METHOD FOR THEIR FORMATION

CROSS REFERENCE TO RELATED APPLICATIONS

This application is a continuation-in-part of U.S. patent application Ser. No. 12/869,215, which was filed Aug. 26, 2010. This application also claims priority under 35 U.S.C. § 119(e) of U.S. Provisional Patent Application Ser. No. 62/001,995, filed May 22, 2014. This application also claims priority under 35 U.S.C. § 119(e) of U.S. Provisional Patent Application Ser. No. 61/237,155, filed on Aug. 26, 2009. The subject matter of each of the earlier filed applications is hereby incorporated by reference in their respective entireties.

This invention was made with United States Government support under Contract No. H9823004C0448 awarded by the National Security Agency and under Contract No. DMR0520471 awarded by the National Science Foundation. The United States Government has certain rights in this invention.

BACKGROUND

Field

Embodiments of the invention relate to an apparatus, system, and method for nanostucture-based devices for electrical energy management. More particularly, embodiments of the invention relate to an apparatus, system, and method for providing nanostructure arrays as two-terminal devices, for example, nanotube or nanowire devices (hereinafter referred to as "nanodevices"), configured to store electrical energy, to capture and generate energy, and to integrate with power management circuitry.

Description of the Related Art

The limitations of conventional capacitor and battery devices are well known. Charge storage devices can exhibit similar limitations experienced by conventional solar cell devices, as will be discussed below. Electrostatic capacitors that store charge at the surface of electrodes typically do not achieve high areal densities of the electrodes. Electrochemical supercapacitors and batteries that store charge inside their active surfaces and at the surface also can experience similar limitations experienced by conventional solar cell devices, as will be discussed below. While sub-surface charge storage can enhance energy density, the resulting slow ion/charge transport into these materials can limit available power.

The limitations of conventional devices for energy capture and storage are also well known. In semiconductor pn junction solar cells, planar device layers typically create only a single depletion layer over the surface to separate photo-induced carriers. As a result, each substrate of a semiconductor pn junction solar cell can be limited to only a single active layer. Furthermore, some of the semiconductor material can absorb light, producing excitations outside a depletion range. This can prevent the separation of positive and negative charges and the collection of harvested light energy.

Currently, alternate solar cell structures are being explored that utilize nanocomposite structures that mix nanoparticles, such as C-60 or carbon nanotubes, with organic materials having random spatial distributions on a nanoscale. These nanocomposite structures can provide a high density of interfaces between the component materials, effectively enhancing the active regions, analogous to depletion regions in pn junction semiconductor structures, where charge separation can occur.

However, the nanoscale randomness of the component materials can impede efficient collection of charges at micro- or macro-scale external contacts where charge should be produced, for example, through high electrical resistance through which the charge reaches the contacts. Additionally, these materials, such as conducting polymers, can have relatively high resistivity, further diminishing the efficiency of charge collection at the external contacts.

A number of nanostructures have been explored to improve the power and energy density of conventional capacitor and battery devices and conventional solar cell devices, primarily exploiting higher surface area densities per unit volume of material used in these devices. For example, a high density of nanowires on a surface can substantially enhance the surface area available, producing higher charge density per unit planar area. Furthermore, nanowire and nanotube structures can present shortened pathways for ion transport into the surface, thereby increasing power density. These advancements in technology promise improvements in energy devices, particularly if nanostructures can be formed with sufficient control at the nanoscale to realize functioning and reliable aggregation of massive arrays of nanostructures into larger working devices addressed at the macro- or micro-scale external contacts.

Nanotechnology provides new options for meeting these requirements, particularly using self-assembly phenomena and self-alignment to build more complex nanodevices from simpler nanostructures. For example, anodic aluminum oxide (AAO) can achieve highly regular arrays of nanopores through specific recipes for anodic oxidation of aluminum. Nanopores in AAO may have uniform size and spacing in a hexagonal pattern.

SUMMARY

In accordance with an embodiment of the invention, there is provided a vertical nanotube device, which includes a substrate, and a template material disposed on the substrate. The vertical nanotube device can further include a column disposed in the template material extending from a first side of the template material to a second side of the template material. Further, the vertical nanotube device can include a first material disposed within the column, a second material disposed within the column, and a third material disposed in the column.

In accordance with an embodiment of the invention, there is provided a vertical two-terminal nanotube device, which includes a column disposed in a template material extending from a first side of the template material to a second side of the template material. The vertical two-terminal nanotube device further includes a first material disposed within the column, a second material disposed within the column, and a third material disposed in the column.

In accordance with an embodiment of the invention, there is provided a vertical two-terminal nanotube device, which includes a plurality of columns, each column disposed in a template material extending from a first side of the template material to a second side of the template material. The vertical two-terminal nanotube device further includes a first material disposed within the column, a second material disposed within the column, and a third material disposed in the column. The plurality of columns are connected in parallel by a first wiring structure operatively connected to an exposed end of the first material, and a second wiring structure operatively connected to an exposed end of the second material. The first and the second wiring structures are configured on a top surface and a bottom surface of the column, respectively.

In accordance with an embodiment of the invention, there is provided a vertical two-terminal nanotube device having a plurality of columns. Each column is disposed in a template material extending from a first side of the template material to a second side of the template material. The device further includes a material disposed within the column. The material includes an electrolyte. The vessel further includes a first wiring structure operatively connected to a top surface of the plurality of columns, and a second wiring structure operatively connected to a bottom surface of the plurality of columns. The first and the second wiring structures are configured on a top surface and a bottom surface of the column, respectively.

In accordance with an embodiment of the invention, there is provided a method, which includes the step of forming a columnar pore in an exposed portion of a material layer, depositing a first material into a first distal end of the columnar pore, and depositing a second material into the first distal end of the columnar pore.

BRIEF DESCRIPTION OF THE DRAWINGS

Further aspects, details, advantages and modifications of the present invention will become apparent from the following detailed description of the embodiments which is to be taken in conjunction with the accompanying drawings, in which:

FIG. 6a shows a schematic of a metal-insulator-metal nanocapacitor fabricated by multiple atomic layer deposition steps in anodic oxide aluminum oxide nanopores to form an energy storage structure, in accordance with an embodiment of the invention.

FIG. 6b shows a scanning electron micrograph of the metal-insulator-metal nanocapacitor shown in FIG. 6a, in accordance with an embodiment of the invention.

FIG. 6c shows another scanning electron micrograph of the metal-insulator-metal nanocapacitor shown in FIG. 6a, in accordance with an embodiment of the invention.

DETAILED DESCRIPTION OF THE EMBODIMENTS

Figure 1A:
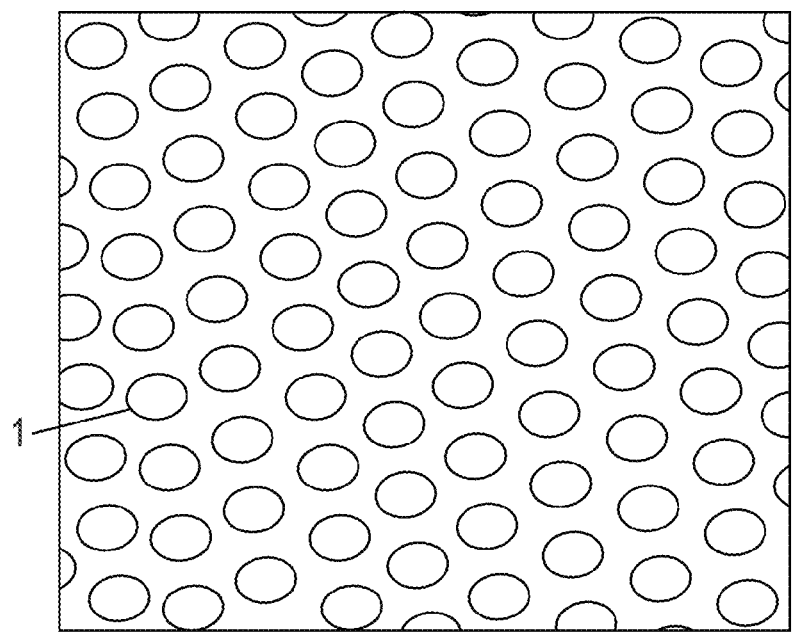
FIGS. 1a and 1b show a scanning electron micrograph of AAO nanopore arrays, in accordance with an embodiment of the invention.

Embodiments of the invention provide two-terminal nanodevice arrays that utilize nanostructures having nanopores formed by anodic oxidation of aluminum, and thin films deposited by atomic layer deposition (ALD) and electrochemical deposition (ECD) to form devices in the nanopores. These nanostructures may be coupled to one another to form larger assemblies suitable for power and energy systems.

Certain embodiments of the invention provide two-terminal nanodevice arrays for capture, generation and storage of energy based on multi-component materials contained within nanoscale pores in aluminum oxide or another dielectric material. A plurality of these nanodevice arrays may be wired in parallel to capture energy from light, either solar or ambient, and to generate energy from temperature gradients sensed by thermoelectric devices.

Embodiments of the invention provide electrostatic capacitors, electrochemical capacitors, and batteries for energy storage, whereby device layers for energy capture, generation or storage, can be combined one on top of another or laterally to provide enhanced functionality, including energy and power management systems and electrical power management circuitry with components for capture, generation, storage and distribution.

The two-terminal nanodevices, in accordance with embodiments of the invention, are formed as nanotubes or nanowires within nanopores initially formed as arrays in a nanopore template. Two electrical contacts can be formed at one end of a nanodevice, whereby one contact is brought to an end of the nanopore where the other contact is formed by a conducting nanotube outside one of the two terminals or by a conducting nanowire inside one of the two terminals. In another embodiment, the two electrical contacts can be formed at each end/side of the nanopore.

Once the two-terminal nanodevice has been fabricated, it may be used as formed in the nanopore as an embedded nanodevice. Alternatively, portions of the two-terminal nanodevice may be exposed by removing a portion of or the entire surrounding nanopore template. Such exposure is important, for example, in electrochemical energy storage devices, where the two terminals must each be in contact with an electrolyte formed between them.

An array of two-terminal nanodevices, in accordance with certain embodiments of the invention, can be employed as electrical energy storage devices, including, for example, electrochemical devices (e.g., electrochemical supercapacitors, pseudo-capacitors and double-layer capacitors), batteries (e.g., lithium ion batteries), and electrostatic capacitors. These two-terminal nanodevices can also be used as electrical energy capture devices functioning as solar cells based on either semiconducting pn junctions or metal/semiconductor Schottky barriers.

Further, these two-terminal nanodevices can be used as generators of thermoelectric energy from temperature gradients between the two terminals. For example, thermoelectric nanowires or nanotubes are provided between hot and cold terminals, and the intervening insulating material is chosen to minimize heat flow between the two terminals, so that a temperature gradient and thermoelectric voltage are maximized. These thermoelectric nanodevices can be employed as energy capture devices (i.e., for power generation) or as sensors (i.e., in conjunction with bolometers at one terminal to capture infrared images).

According to some embodiments of the invention, the two-terminal nanodevice can be used to perform optical, chemical or sensing functions. The pn junction or Schottky barrier configurations, as discussed above for solar cells, can be operated as light sources (e.g., light-emitting diodes or lasers) and/or as optical detectors. For sensing, the nanodevices may be material layers formed as nanotubes inside nanopores with the two terminals sensing resistance or other electrical changes as chemicals introduced into the nanopores chemically modify the sensing material or as other environmental changes (e.g., touch and pressure) modify the surfaces of the sensing material layers.

According to other embodiments of the invention, multilayer types of nanodevices may be combined into a power management system, including energy generation/capture, storage and distribution. These systems may include multiple layers of nanodevice arrays connected in three dimensional configurations.

Figure 1B:
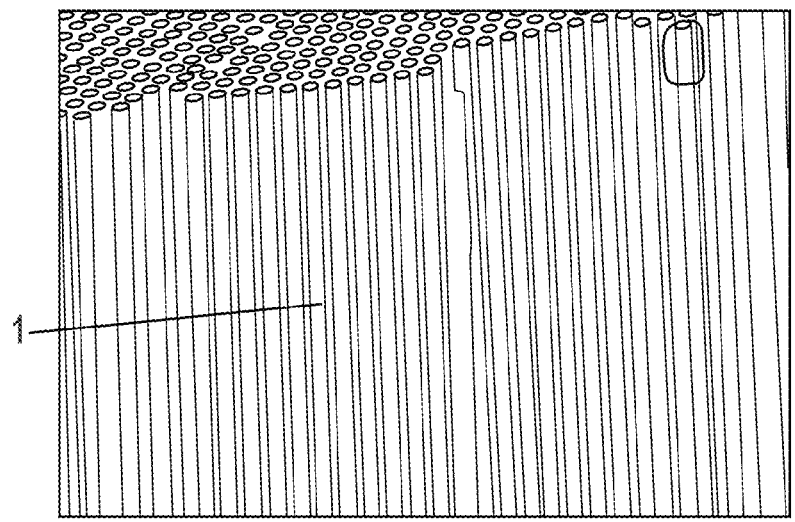

FIGS. 1a and 1b show a scanning electron micrograph of AAO nanopore arrays, in accordance with an embodiment of the invention. In particular, FIG. 1a is a top view and FIG. 1b is a side view of an AAO nanopore array, in accordance with an embodiment of the invention. The tops of nanopores 1 each provide access to narrow columns of the nanopores 1 that can include therein high aspect ratio nanopore structures, or nanodevices. According to embodiments of the invention, the AAO nanopores are narrow (i.e., 5-300 nm in width) and deep (i.e., 50 nm-100 µm), such that their aspect ratio (depth/width) is of order 1-1000, and more preferably 50-500. The dimensions of the AAO nanopores 1 are based on a choice of electrochemical conditions and sequences used during anodization. For example, for nanopores approximately 70 nm in diameter, their center-to-center spacing can be in the order 100 nm. Furthermore, the density of the AAO nanopores 1, for example $10^{10}$ pores/cm$^2$, can ensure very large active surface areas per unit area. Typically, this area enhancement can be as high as approximately 1000× planar area. Since wet processing can be used, costs associated with vacuum and gas handling technologies can be avoided, and manufacturing costs can be modest. Thus, AAO can provide a cheap and attractive platform for high density nanostructures and devices made from them.

A particular advantage of AAO nanostructures can be that massive arrays can be fabricated with a high degree of control over their shape and spatial relationship, including their depth, width, and vertical shape (all controlled by anodization conditions). The regularity which results is ultimately of major value for manufacturability, providing predictability for properties for the full array. The nanopore arrays can have dimensions comparable to that produced by costly, sophisticated lithography and etching processes in the formation of dynamic random access memory capacitors. However, natural self-assembly from the anodization process itself produces the structures without need for such complex manufacturing steps.

Deposition techniques capable of introducing materials for electrical devices into very high aspect ratio nanopores are limited. Physical techniques, such as evaporation and sputter deposition, cannot sufficiently penetrate deeply into the pores, but chemical methods are suitable. Electrochemical deposition, carried out in electrolytic solutions, can successfully cope with the high aspect ratio because electric fields are established between a bottom region of the pore and a counter-electrode removed from the pore in the electrolyte.

Figure 1C:
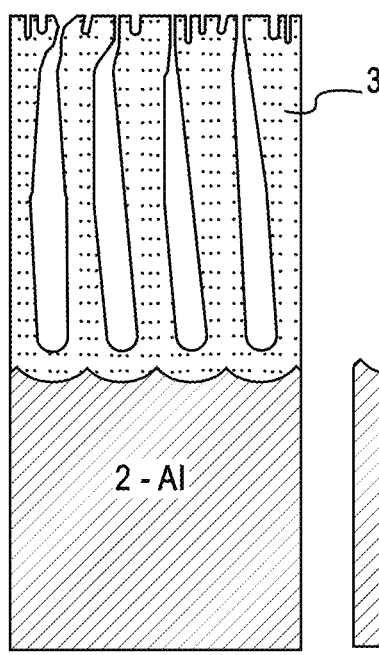
FIGS. 1c to 1e show a formation of ordered arrays of nanopores through anodic oxidation of aluminum, in accordance with an embodiment of the invention.
Figure 1D:
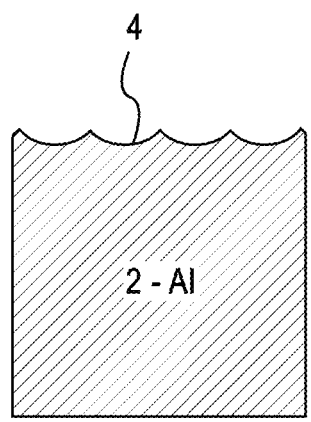
Figure 1E:
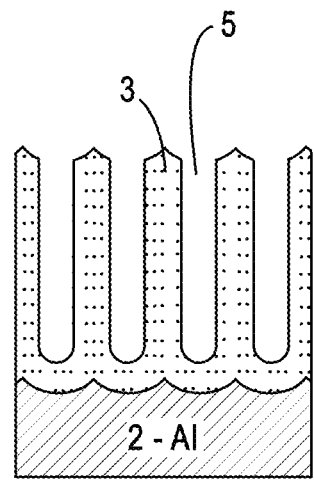

FIGS. 1c to 1e show a formation of ordered arrays of nanopores through anodic oxidation of aluminum, in accordance with an embodiment of the invention. As shown in FIG. 1c, an anodic oxidation of a substrate 2, for example aluminum, is performed to create AAO 3 with a plurality of parallel nanopores formed therein, which increasingly order into regular arrangements with uniform dimensions. After the ordering is sufficiently established, the AAO 3 created above the aluminum substrate 2 is chemically removed to leave an aluminum surface having an ordered, patterned array 4 (i.e., a scalloped-shaped structure), as shown in FIG. 1d. With this ordered, patterned array in place, a second anodic oxidation step, as shown in FIG. 1e, is performed to create a new structure of AAO 3, which produces a highly ordered, uniform nanopore array 5 above the aluminum substrate 1.

AAO formation can be carried out using a variety of process parameters, including choice of acid, concentration, voltage, and time. While AAO is the preferred process and material for very high aspect ratio nanopore arrays, in accordance with embodiments of the invention, a person of ordinary skill in the relevant art will recognize that other materials (e.g., titanium or silicon) can be anodically oxidized to form nanopores. Alternatively, nanopore arrays can be produced by track etching, in which high energy ions bombard a film (e.g., polymer or mica) to form damage tracks in the material. The damaged material is then removed by selective etching to form nanopores through it.

The aluminum substrate 2, which is reacted and partially consumed to form the AAO nanopore array 5 can be used in various forms. Aluminum sheets are commercially available which can be used directly. Such sheets may be anodically bonded to a substrate (e.g., glass), or otherwise attached to a thicker substrate, particularly to facilitate subsequent processing to form devices, as done in microelectronics. A thin film of aluminum may also be deposited on a substrate (e.g., glass or silicon). The quality of AAO nanopore uniformity and ordering may vary with the properties of the aluminum (e.g., purity, grain size, etc.). For very high aspect ratio nanopores and ultimately nanodevices in them, aluminum sheets may be preferred to avoid very long thin film deposition times.

According to embodiments of the invention, as will be discussed below, material layers are created within the AAO nanopores to form two-terminal nanodevices and arrays thereof. While such nanodevices include multiple material layers created by different deposition processes, the preferred processes are limited to those capable of penetrating deeply into nanoscale pores. These include, for example, ALD and ECD, as will be discussed in more detail below.

Figure 2:
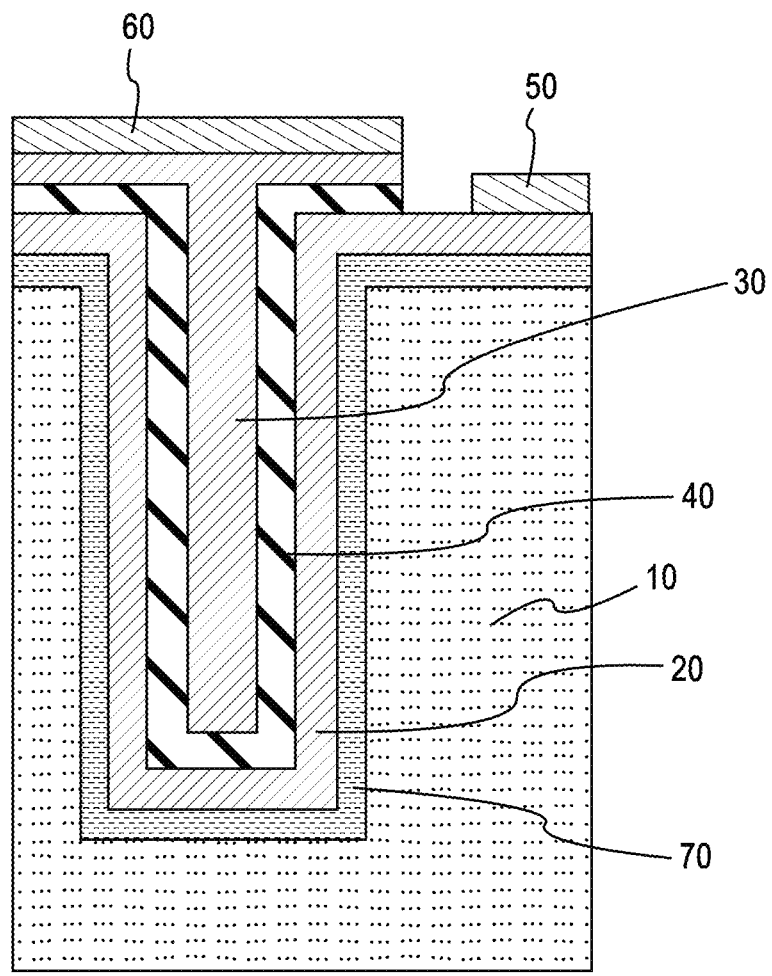
FIG. 2 shows a schematic of a two-terminal electrostatic capacitor nanodevice formed within a nanopore, in accordance with an embodiment of the invention.

FIG. 2 shows a schematic of a two-terminal electrostatic capacitor nanodevice formed within a nanopore, in accordance with an embodiment of the invention. As illustrated in FIG. 2, a metal-insulator-metal (MIM) layer structure can be formed in a nanopore in AAO 10. In particular, a first material 20, as a bottom electrode, can be disposed through a first distal end of the nanopore 10, extending along the inner walls to a second distal end of the nanopore 10. A second material 30, as a top electrode, can be disposed through the first distal end of the nanopore 10, extending along the inner walls of the first material 20 to the second distal end of the nanopore 10. The first material 20 and the second material 30 can be concentrically disposed within the nanopore 10.

The first material 20 and the second material 30 can be separated by a dielectric layer 40, producing an internal electrical field for separating charges created by light absorption. By suitable patterning of layers on the first distal end of the nanopore 10, a first electrical contact 50, as a bottom electrode contact, can be formed to provide electrical current to the first material 20, and a second electrical contact 60, as a top electrode contact, can be formed on the top surface of the AAO nanopore template 10 to provide electrical current to the second material 30. As will discussed below, patterning of such contacts can be performed on the scale of one micrometer or larger feature size, realizing lithographic processes and wiring which are routine and inexpensive (i.e., consistent with decades-old microelectronics technology). Such patterned wiring allows a massive array of nanodevices (i.e., millions or more) to be wired in parallel to achieve practical functionality for energy storage (i.e., or energy capture).

The electrostatic capacitor nanodevice, as shown in FIG. 2, can also include a passivation layer 70 formed between the AAO surface and the first material 20 to protect the nanodevice from any impurities, defects, or roughness present at the AAO surface. It is known that the AAO process, electrochemical in nature and carried out in complex acidic solutions, can incorporate impurities from the electrolytic solution into the AAO material.

While a variety of processes may be used to create the layers in the electrostatic capacitor nanodevice shown in FIG. 2, ALD is a preferred method to obtain very high aspect ratios. Utilizing alternating sequences of chemical precursors needed for film growth, ALD exploits the self-limiting adsorption/reaction behavior for each precursor pulse to achieve unprecedented control and uniformity of thickness at the atomic level. This enables highly controlled formation of multiple material layers, each a few nanometers thick, within narrow AAO nanopores. The control and uniformity achieved in ALD persists even in very high aspect ratio nanopore structures, making ALD nearly ideal as a deposition technique for two-terminal nanodevice fabrication in very high aspect ratio nanopores.

Materials for the first material 20 and the second material 30 can be electrically conducting so that they can transport charge to and from their surfaces, storing it particularly at their interfaces with the dielectric layer 40 to achieve high power and energy density. Materials for the electrodes can include metals, such as aluminum (Al), copper (Cu), tungsten (W), binary compounds, such as titanium nickel (TiN) or tungsten nickel (WN), or more complex materials, such as indium tin oxide (ITO). The materials for the first material 20 and the second material 30 may be different or the same. The material for the dielectric layer 40 can include aluminum oxide ($Al_2O_3$) or a high-K dielectric, silicon dioxide ($SiO_2$), or other insulating materials. For the dielectric layer 40, the material preferably has properties including high conformality, low leakage current, high breakdown field, and high dielectric constant.

Embodiments of the invention for the electrostatic capacitor nanodevice, as discussed above, provide advantages over conventional electrostatic capacitors. These advantages arise from the dramatically enhanced surface area of the first material 20 as a bottom electrode and the second material 30 as a top electrode compared to conventional planar structures. In such devices, energy is stored at electrode surfaces, which for high aspect ratio nanodevices have areas enhanced by 100-300× or more compared to planar capacitor geometries. While these devices already feature high power density, their dramatically increased surface area enlarges their energy density by corresponding factors.

Figure 3:
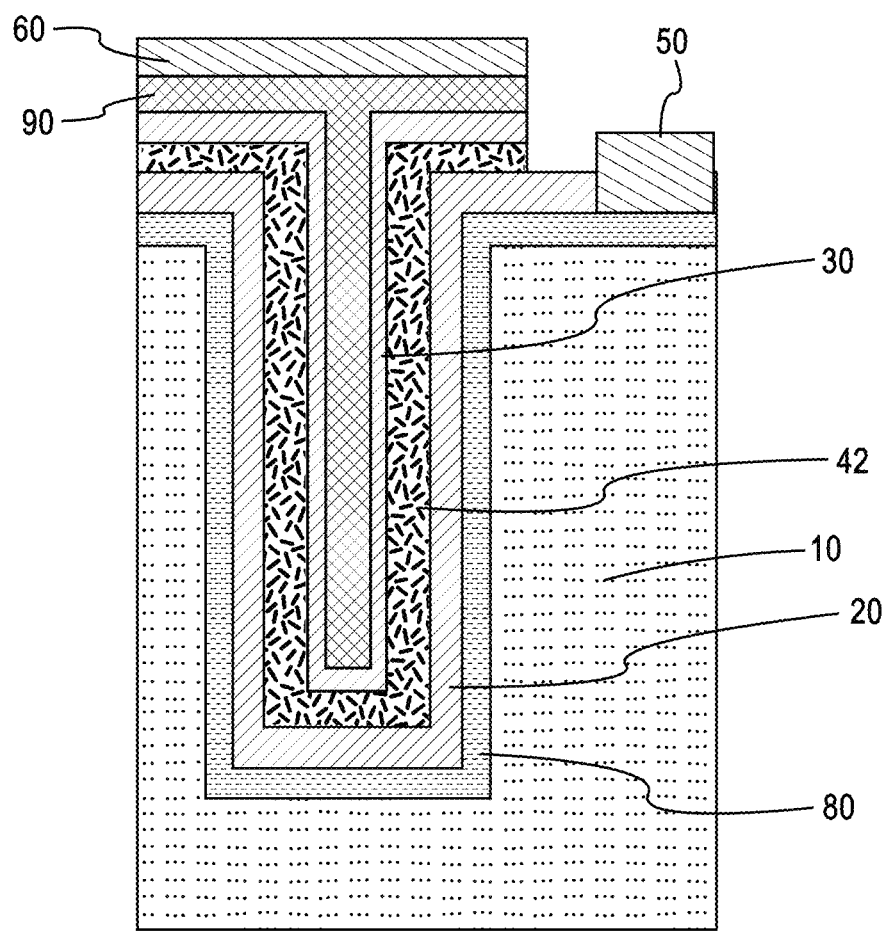
FIG. 3 shows a schematic of a two-terminal electrochemical supercapacitor or battery nanodevice formed within a nanopore, in accordance with an embodiment of the invention.

FIG. 3 shows a schematic of a two-terminal electrochemical supercapacitor or battery nanodevice formed within a nanopore, in accordance with an embodiment of the invention. As illustrated in FIG. 3, an electrochemical supercapacitor or battery nanodevice can be formed in a nanopore in AAO 10. A first material 20, as a bottom electrochemical electrode, can be disposed through a first distal end of the nanopore 10, extending along the inner walls to a second distal end of the nanopore 10. A second material 30, as a top electrochemical electrode, can be disposed through the first distal end of the nanopore 10, extending along the inner walls of the first material 20 to the second distal end of the nanopore 10. The first material 20 and the second material 30 can be concentrically disposed within the nanopore 10.

The first material 20 and the second material 30 can be separated by a solid, gel or polymer electrolyte 42 that can be retained in the structure under varying conditions of use to achieve supercapacitor or battery functionality. By suitable patterning of layers on the first distal end of the nanopore 10, a first electrical contact 50, as a bottom electrode contact, can be formed to provide electrical current to the first material 20, and a second electrical contact 60, as a top electrode contact, can be formed on the top surface of the AAO nanopore template 10 to provide electrical current to the second material 30.

The first material 20 as the bottom electrochemical electrode and the second material 30 as the top electrochemical electrode are made of materials suitable for ion transport and charge storage. For example, these materials can include metal oxides (e.g., $MnO_2$, $LiMnO_2$, $CoO_2$, $V_2O_5$, $TiO_2$, etc.), which are particularly suitable for electrochemical capacitors or battery cathodes, as well as carbon, silicon, or others suited for battery anodes.

Because the electrochemical electrode materials typically have lower electrical conductivity than metal, conducting electrodes, a first current collecting layer 80 can be formed between the AAO surface and the first material 20, and similarly a second current collecting layer 90 can be formed on an outer surface of the second material 30. Current collecting layers 80, 90 are preferably formed from metallic or highly conducting material, so that electronic charge from the first and second materials 20, 30, as bottom and top electrochemical electrodes, can be readily transported to and from the first and second electrical contacts 50, 60.

Embodiments of the invention for the electrochemical supercapacitor or battery nanodevice, as discussed above, provide advantages over conventional electrochemical supercapacitors or batteries. These advantages arise primarily in the form of increased power density. Since charge is transported and stored in electrochemically active electrodes as ions and atoms, their diffusion in the electrode materials is rather slow, leading to limitations on how fast charge may be moved, i.e., reduced power capability. By using very thin layers of electrochemically active electrode materials, ion/atom charge transport times are shorter, resulting in higher power capability.

Figure 4:
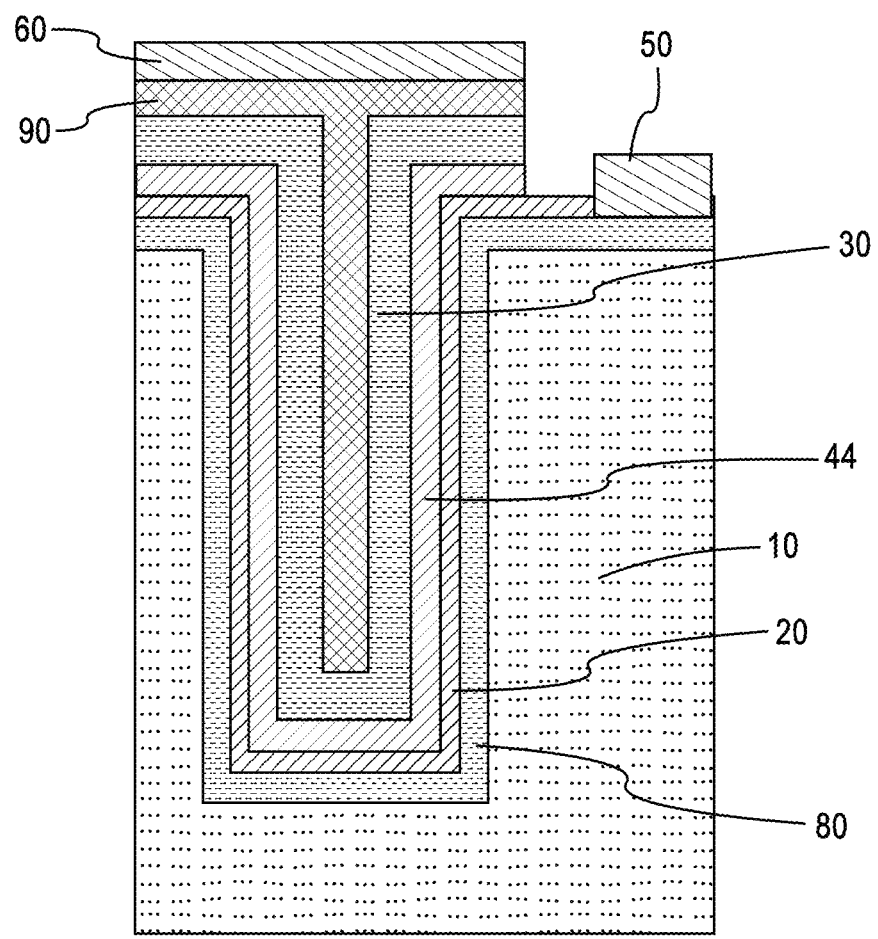
FIG. 4 shows a schematic of a two-terminal solar cell nanodevice formed within a nanopore, in accordance with an embodiment of the invention.

In accordance with embodiments of the invention, two-terminal nanodevices, such as a two-terminal solar cell nanodevice formed within a nanopore, as shown in FIG. 4, also capture energy. As shown in FIG. 4, the two-terminal solar cell nanodevice includes a first material 20, as a bottom semiconducting electrode, that can be disposed through a first distal end of the nanopore 10, extending along the inner walls to a second distal end of the nanopore 10. A second material 30, as a top semiconducting electrode, can be disposed through the first distal end of the nanopore 10, extending along the inner walls of the first material 20 to the second distal end of the nanopore 10. The first material 20 and the second material 30 can be concentrically disposed within the nanopore 10. In the solar cell nanodevice, the first material 20 includes a n-type semiconductor material, and the second material 30 includes a p-type semiconductor material, or vice versa. The first material 20 and the second material 30 provide the basic function of capturing solar energy and separating electron and hole charge in the pn junction solar cell nanodevice.

A depletion region 44 is formed at the interface between the two semiconductor layers, providing an electric field within the depletion region that separates the electron-hole pair created by photon (light) absorption. By suitable patterning of layers on the first distal end of the nanopore 10, a first electrical contact 50, as a bottom electrode contact, can be formed to provide electrical current to the first material 20, and a second electrical contact 60, as a top electrode contact, can be formed on the top surface of the AAO nanopore template 10 to provide electrical current to the second material 30.

The solar cell nanodevice can further include a first current collecting layer 80 formed between the AAO surface and the first material 20, and similarly a second current collecting layer 90 formed on an outer surface of the second material 30. First and second electrode current collection layers 80, 90 are preferred in many situations to improve efficiency with which electron and hole charge can be transported to first and second electrical contacts 50, 60. It should be noted that the second (top) electrode current collection layer 90 and the second electrical contact 60 should be transparent to solar radiation, enabling it to reach the depletion region 44. A variety of conducting materials satisfy this requirement, such as indium tin oxide and aluminum zinc oxide.

Accordingly, certain embodiments of the present invention can produce a favorable energy capture per unit volume and per unit weight in solar cell devices.

Embodiments of the invention for the solar cell nanodevice, as discussed above, provide advantages over conventional solar cell nanodevices. Because sunlight penetrates rather deeply into semiconducting materials (i.e., a significant fraction of a micrometer), the solar cell nanodevices, as discussed above, formed in deep (i.e., 1-10 micrometers) nanopores can efficiently absorb much of the solar radiation incident from above. Because the semiconducting layers are thin (i.e., enough to fit within the nanopores), the depletion regions can include a significant fraction of the layer thickness, so that a large fraction of electron-hole pairs created by light absorption can be separated to deliver useful currents. Depletion lengths can be increased by choosing lower doping (i.e., carrier concentration) levels of the semiconductors, while the resulting higher resistance of the semiconductor layers places a premium on using current collecting layers.

In accordance with another embodiment of the invention, the solar cell nanodevice, as shown in FIG. 4, can be formed as a Schottky barrier solar cell, rather than a pn junction. In this embodiment, one of the first material 20 and the second material 30, as semiconducting layers, is replaced by a metal layer, which forms a rectifying Schottky barrier to the other semiconductor layer. Schottky barriers, rather than ohmic contacts, are typically formed between transition metals and n-type semiconductors. The Schottky barrier contact to a semiconductor produces a depletion region 44 inside the semiconductor, where electron-hole charge separation can occur, essentially circumventing the need to fabricate two-terminal nanodevices with only one material at each distal end.

Figure 5:
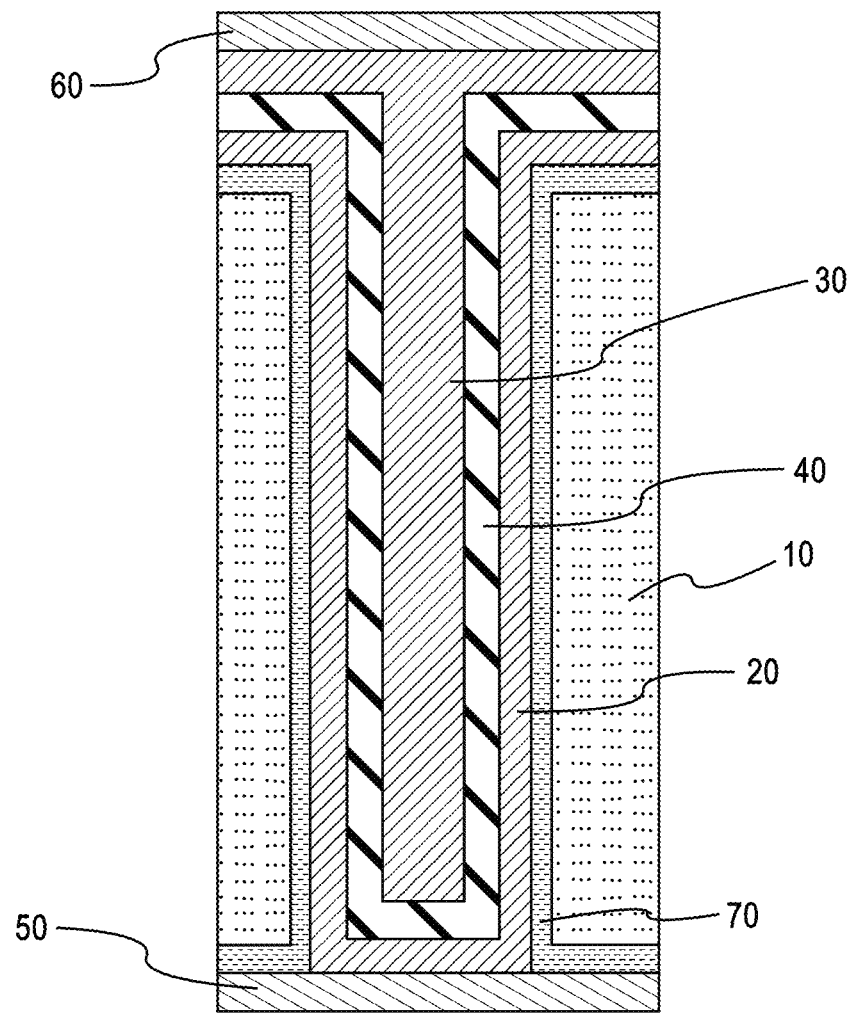
FIG. 5 shows a schematic of a two-terminal nanodevice in which contacts are provided at opposite ends of a nanopore, in accordance with an embodiment of the invention.

In another embodiment of the invention, the two-terminal nanodevices shown in FIGS. 2-4 may include first and second electrical contacts 50, 60 formed at opposite ends of the nanopore 10. For example, FIG. 5 shows a schematic of a two-terminal nanodevice in which contacts are provided at opposite ends of a nanopore, in accordance with an embodiment of the invention. The two-terminal capacitor nanodevice shown in FIG. 5 includes the same general configuration discussed above for the electrostatic capacitor nanodevice, as shown in FIG. 2, with the exception that the first electrical contact 50 is formed at the second distal end of the nanopore 10 (i.e., at the bottom of the nanopore 10), while the second electrical contact 60 is formed at the first distal end of the nanopore 10.

To form the two-sided contact arrangement, as shown in FIG. 5, the first material 20 must be exposed from the bottom side of the AAO nanopore 10 template. This requires removal of the bottom side of the AAO nanopore 10 template by wet or dry etching of the aluminum substrate 2 left under the nanopore 10, as shown in FIG. 1e, a process that may be done in a pattern, so that a mechanical support structure of the remaining aluminum substrate 2 and the AAO 3 layer remain over larger distances. Also, as shown in FIG. 1e, the AAO 3 layer at the bottom of the nanopore array 5 must be opened by similar etching or otherwise removed by modification of the AAO nanopore fabrication process.

With the first material 20 exposed at the bottom of the nanopore 10 template, the first electrical contact 50 can be provided below the AAO nanopore 10 template, as shown in FIG. 5. Depending on the process sequence chosen, the first electrical contact 5 may connect to the bottom of the first material 2 at the level of the bottom surface of the AAO nanopore 10, or it may penetrate into the AAO nanopore 10 to reach the first material 20 somewhat above the bottom surface of the AAO nanopore 10.

The two-sided contact structure, as shown in FIG. 5, can be achieved for other nanodevices, such as those depicted in FIGS. 2, 3 and 4, as discussed above, and in FIGS. 7, 8 and 9 to be discussed below. Having the electrical contacts 50, 60 for the two nanodevice terminals at opposite ends of the nanodevice offers advantages over conventional devices. For example, these two-terminal nanodevices enable nanodevice designs, such as those shown in FIGS. 7, 8 and 9, and provide process variations that provide a high degree of design flexibility in the structure of the nanodevices.

One benefit of the two-sided contact structure, in accordance with embodiments of the invention, is that the first electrical contact 50 can be provided at the bottom of the unfilled nanopore 10 and used as an electrode for ECD of materials into the nanopore 10. ECD can be used to deposit a wide range of materials, involves lower cost than ALD, and can be employed to produce different shapes of the ECD electrode, specifically as nanowires filling the nanopore 10, or as nanotubes from deposition against the nanopore 10 sidewall. As ECD begins at the electrode at the bottom of the open nanopore 10, its height within the pore can be controlled by the process time. Furthermore, multiple materials can be sequentially deposited or simultaneously co-deposited by ECD, providing a significant flexibility in achieving a variety of geometric and compositional shapes.

In this regard, ECD and ALD are complementary in offering design flexibility. While ECD proceeds from an electrode at the bottom of a nanopore 10, ALD grows from the top down into the nanopore 10 and does not require an electrode. ECD can often fully fill a high aspect ratio nanopore, but does not achieve highly uniform coverage on nanopore 10 sidewalls to the extent that ALD can. While ALD is more often employed to coat the entire surface area of the nanopore 10, precursor dose per cycle can be stopped below that needed, resulting in an ALD layer that coats the nanopore 10 surface only partway into the nanopore 10. In these conditions, suitable modification of ALD and ECD process recipes can provide a large variety of nanodevice design options, including uniform or graded thickness profiles extending partway or fully from either end of the nanopore 10.

FIG. 6a shows a schematic of a metal-insulator-metal nanocapacitor fabricated by multiple atomic layer deposition steps in anodic oxide aluminum oxide nanopores to form an energy storage structure, in accordance with an embodiment of the invention. FIGS. 6b and 6c show scanning electron micrographs of the metal-insulator-metal nanocapacitor shown in FIG. 6a, in accordance with an embodiment of the invention.

As shown in FIG. 6a, anodic oxidation of aluminum 2 leads to formation of AAO 3 with deep pores on whose surfaces a sequence of ALD layers can be deposited to create a MIM device structure, as shown in FIGS. 2-4. The detailed structure of MIM layers is seen by scanning electron microscopy in FIGS. 6b and 6c for regions at the top and bottom of the nanopores 10, respectively. In this particular example, the pore diameter was 60 nm, the bottom TiN electrode thickness was 5.6 nm, the AAO dielectric thickness was 6.6 nm, and the top TiN electrode thickness was 12.6 nm, nearly filling the nanopore 10. It should be noted that layer thicknesses could be readily adjusted to fully fill the nanopore or instead to leave internal volume. The pore depth for the structures shown in FIGS. 6a, 6b and 6c was 1 micrometer.

Embodiments of the invention further provide MIM nanocapacitor arrays for both 1 and 10 μm depths, forming capacitors whose macroscopic external contacts to the TiN ALD layers in the MIM structure were made above the nanopores 10 and to the underlying aluminum 1 below the nanopores 10. For example, capacitors with 0.01267 mm$^2$ area (e.g., about 0.1 mm in diameter) connected approximately 10$^6$ nanocapacitor structures, like those shown in FIGS. 6a, 6b and 6c, in parallel and indicated capacitance densities of about 10 and 100 μF/cm$^2$, respectively. This corresponds to an energy density of order 0.7 W-h/kg, placing the performance of these devices well above the energy density of conventional electrostatic capacitors, while retaining comparable power. These nanodevices also provide energy density values that exceed those achieved using all prior microstructure and nanostructure approaches.

Figure 6D:
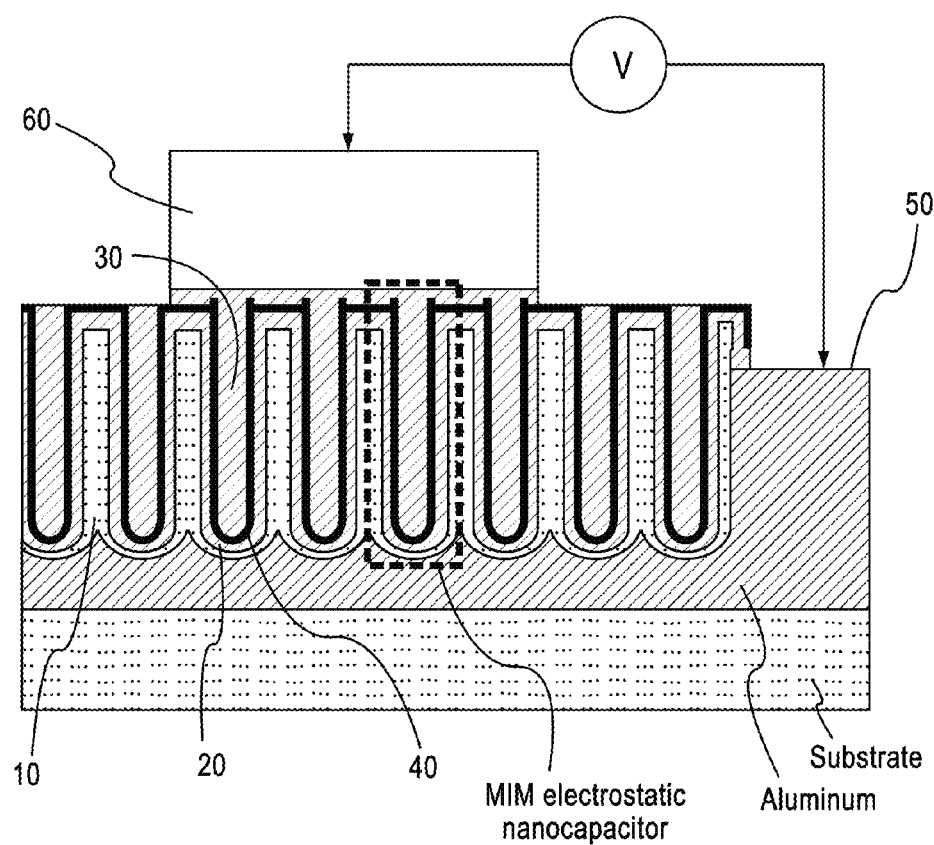
FIG. 6d shows a schematic of an aggregation of an array of metal-insulator-metal nanocapacitors, as shown in FIG. 6a, to form an energy storage device, in accordance with an embodiment of the invention.

FIG. 6d shows a schematic of an aggregation of an array of metal-insulator-metal nanocapacitors, as shown in FIG. 6a, to form an energy storage device, in accordance with an embodiment of the invention. As shown in the scanning electron microscopy of FIG. 6b, MIM trilayer structures from one nanodevice can connect continuously to each other over the top of the AAO material between nanopores. This means that a massive array, (i.e., billions of nanodevices over a few square inch area) are already connected in parallel. To define a suitable set of useful devices, this massive array is then partitioned into smaller devices for testing and use in energy applications, as will be discussed below.

For example, the electrostatic capacitor nanodevices, as shown in FIGS. 6a to 6c within a 125 micrometer diameter region may be wired in parallel to form an aggregate capacitor microdevice. The wiring scheme to create small capacitors is shown in FIG. 6d. As shown in FIG. 6d, a first electrical contact 50 is formed to the first material 20, as a common bottom electrode, of all the nanocapacitors, which are already wired together by their shared ALD bottom electrode layer. Furthermore, by patterning a second electrical contact 60 as a small dot (i.e., with a 125 micrometer diameter), this electrical contact connects only to the nanodevices underneath it, including about one million nanocapacitors (i.e., the MIM electrostatic nanocapacitor shown in FIG. 2). The resulting electrostatic capacitor, composed of a million nanodevices, can then be charged, discharged, tested and used by their first and second electrical contacts 50, 60. Over a massive array of such nanodevices, covering inches or more, many such capacitors can be made and further interconnected to form an electrostatic energy storage system.

This aggregation of nanodevices, accomplished with simple lithographic patterning of wires, is characteristic of how nanodevices and massive arrays made from them are used in accordance with embodiments of the invention. The extent of aggregation used to form such arrays, each of which may be regarded as analogous to a "chip", depends on a variety of performance metrics sought, capabilities of the specific process and nanodevice technology, and regard for testability, yield and reliability. In turn, for massive levels of integration, the microdevices may be wired together to create systems, for example, on the scale of solar panels of order 1 meter in size. Analogous considerations for how this "macro" wiring is designed apply as identified for the microdevice level, as well as how many levels of aggregation and global wiring are used.

Figure 7A:
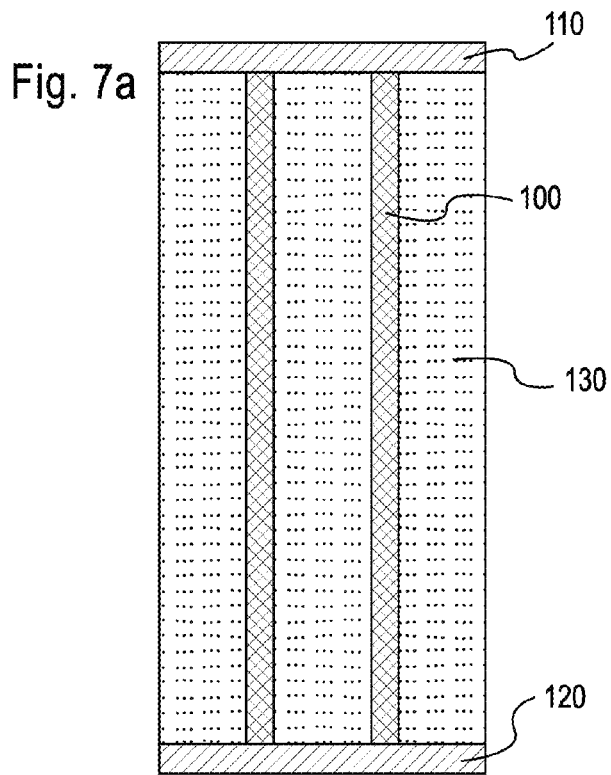
FIGS. 7a and 7b show a schematic of a two-terminal thermoelectric nanodevice formed within a nanopore, in accordance with an embodiment of the invention.
Figure 7B:
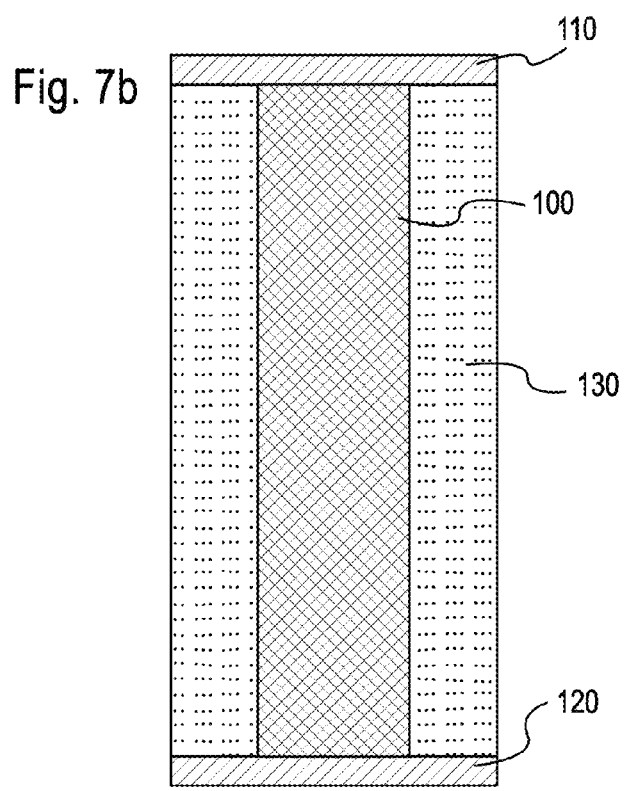

FIGS. 7a and 7b show a schematic of a two-terminal thermoelectric nanodevice formed within a nanopore, in accordance with an embodiment of the invention. The two-terminal thermoelectric nanodevice, as shown in FIGS. 7a and 7b, use a two-sided contact configuration, as shown in FIG. 5, and discussed above.

Electrical energy can be extracted from a thermoelectric material (e.g., bismuth telluride), when a temperature gradient exists between two positions in the material. As shown in FIGS. 7a and 7b, a thermoelectric material 100 is formed as a nanotube or a nanowire within a nanopore 10. The nanopore 10 initially includes AAO material (note: aluminum oxide has a low thermal conductivity). Metal contacts 110, 120 at the top and the bottom of the nanopore are connected electrically to the thermoelectric nanotube or nanowire 100. If the top metal contact layer 110 is placed in thermal contact with a gas, liquid or solid at elevated temperature T1, while the bottom metal contact layer 120 remains at a lower temperature T2, a voltage is generated between the metal contacts 110, 120 to generate power. Once formed, the AAO material may be removed in some locations, or replaced by another insulating material with an even lower thermal conductivity, so that higher thermal gradients and thermoelectric power can be attained.

Figure 7C:
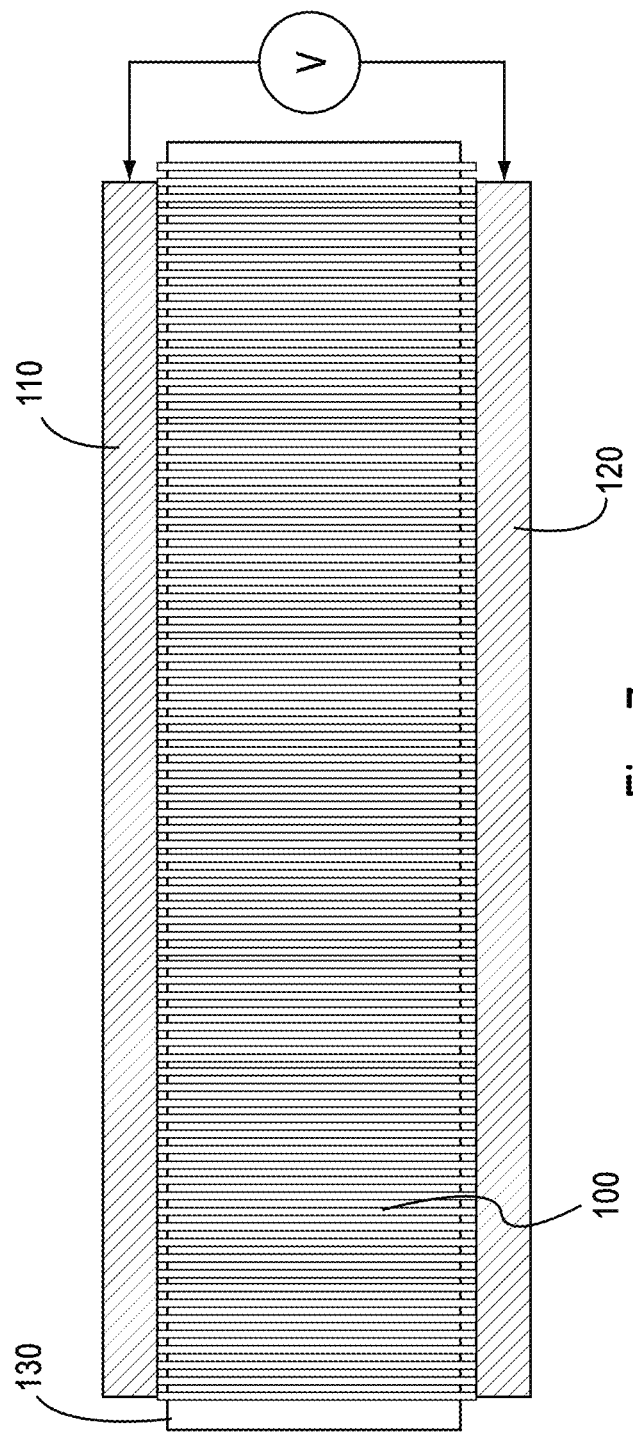
FIG. 7c shows a schematic of an aggregation of an array of thermoelectric nanodevices, as shown in FIG. 7a or 7b, to form an energy storage device, in accordance with an embodiment of the invention.

These thermoelectric nanodevices, as shown in FIGS. 7a and 7b, may be arranged in an array, as shown in FIG. 7c. FIG. 7c shows a schematic of an aggregation of an array of thermoelectric nanodevices, as shown in FIG. 7a or 7b, to form an energy storage device, in accordance with an embodiment of the invention. A thermoelectric energy harvesting system, as shown in FIG. 7c, may be employed, for example, to harness excess heat from an engine by contacting the metal contact layer 110 to the engine, while keeping metal contact layer 120 cooled to a lower, ambient temperature (i.e., with air cooling). A low thermal conductivity insulator 130 (e.g., AAO, polymer, porous or air) may be formed at the ends of the thermoelectric energy storage device to insulate energy from escaping the sides of the device.

Thus, in accordance with an embodiment of the invention, a two-terminal thermoelectric nanodevice can serve as the basis for other applications, such as a thermoelectric imaging device. In this case the top metal contact layer 110 can be patterned to form an array of pixels, with image information read out as voltages of the top electrode pixels in comparison to the voltage at the bottom metal contact layer 120. The pixels may be coated by other material to optimize absorption and consequent heating by the radiation, as in an infrared imaging application.

In accordance with another embodiment of the invention, an analogous application involves use of piezoelectric material instead of thermoelectric material in a two-terminal nanodevice configured similarly to the nanodevice shown in FIG. 7c. Mechanical forces applied between the top metal contact 110 and the bottom metal contact 120 layers will generate electrical voltages between these layers if they are connected by piezoelectric nanotubes or nanowires, for example to harvest mechanical energy from vibration or pressure as electrical energy.

Figure 8:
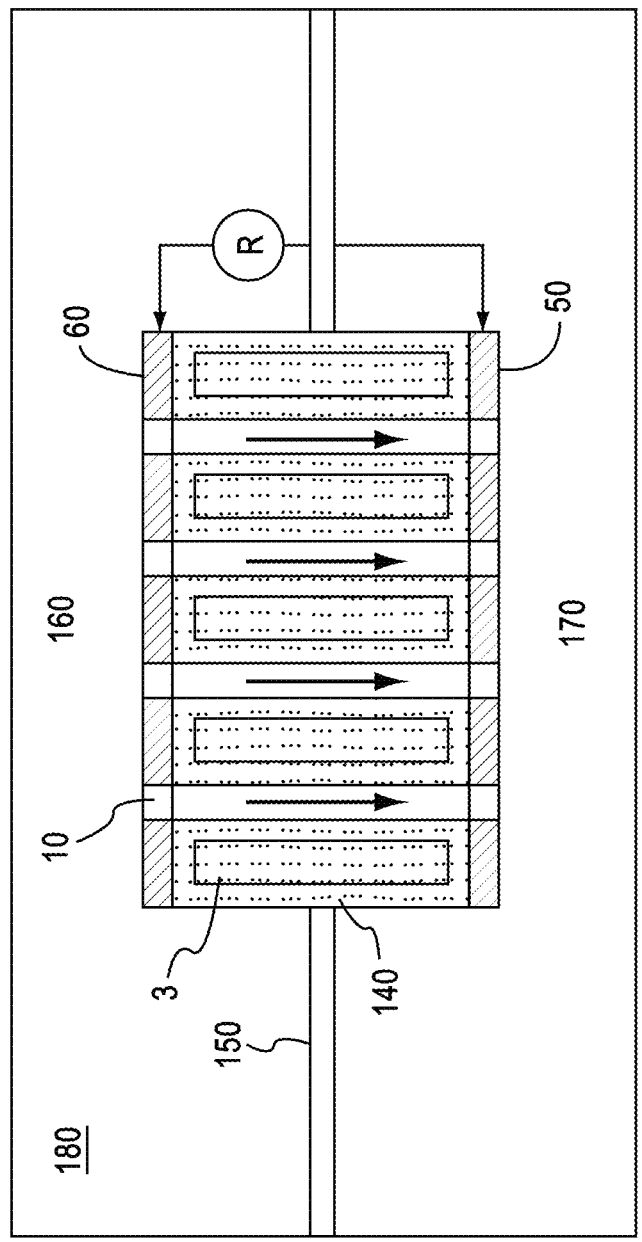
FIG. 8 shows a schematic of a two-terminal nanodevice array disposed to sense chemicals or biochemicals in gaseous or liquid form, in accordance with an embodiment of the invention.

FIG. 8 shows a schematic of a two-terminal nanodevice array disposed to sense chemicals or biochemicals in gaseous or liquid form, in accordance with an embodiment of the invention. As shown in FIG. 8, a sensor material is deposited as nanotubes inside the nanopores. In thin film form, these materials (e.g., tin oxide) have properties that exhibit resistivity changes upon exposure to chemicals (e.g., organic vapors, such as alcohols).

According to an embodiment of the invention, this two-terminal nanodevice array, as shown in FIG. 8, is formed by coating a nanopore 10 and perhaps other surfaces of an AAO membrane 3 with chemical sensing films 140. Metal contacts 50 and 60 are formed at opposite ends of the nanopores to measure resistance of the sensor films during exposure to analytes in gaseous or liquid form. The metal contact structures 50, 60 are shaped such that they do not substantially cover or close the nanopore regions at either end, allowing gas or liquid flow through the nanopores. By sealing the sensing array to a sealing structure 150, which separates a higher pressure chamber 160 from a lower pressure chamber 170 in a pressure controlled vessel 180, gas or liquid from the former is forced to flow through the nanopores 10. As adsorption, absorption, or reaction of species from the gaseous or liquid analyte happens on the sensor material 140, resistance change is measure between metal contacts 50, 60.

Figure 9A:
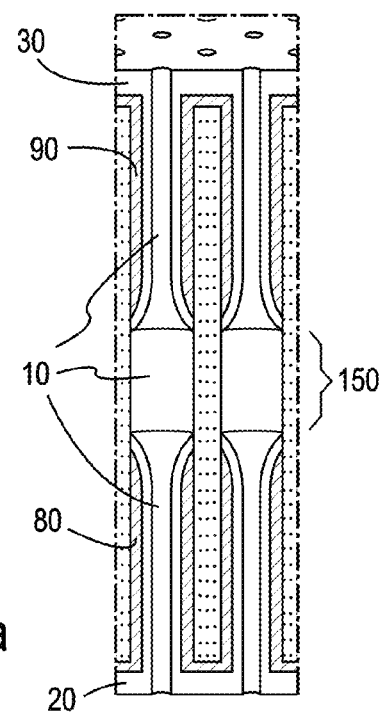
FIG. 9a shows a schematic of a two-terminal electrochemical nanodevice formed within a nanopore that is compatible with a liquid or aqueous electrolyte, in accordance with an embodiment of the invention.
Figure 9B:
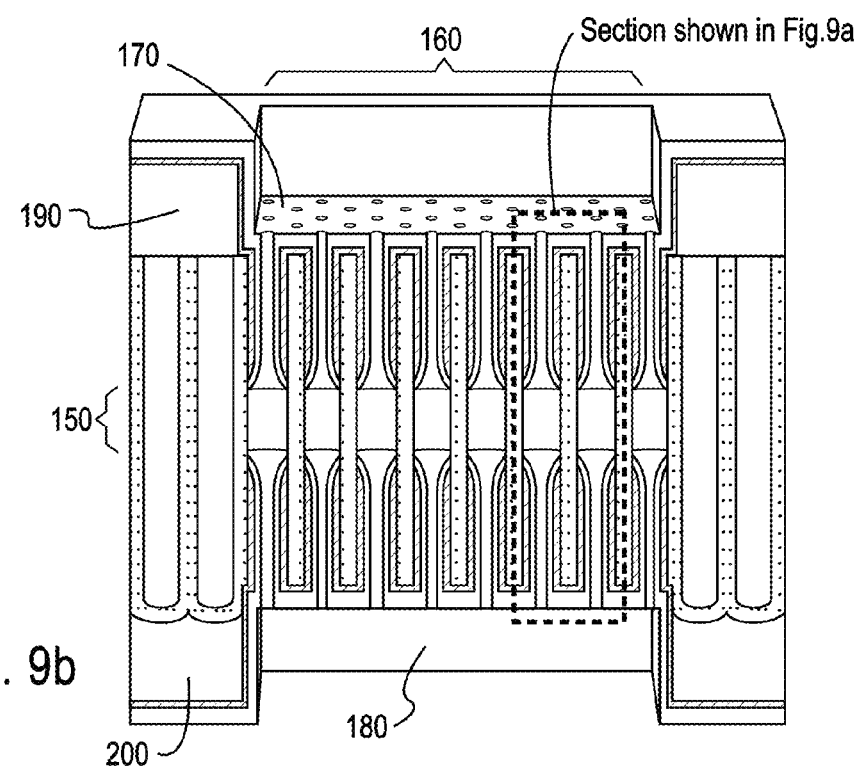
FIG. 9b shows a schematic of an aggregation of an array of electrochemical nanodevices, as shown in FIG. 9a, to form an energy storage device, in accordance with an embodiment of the invention.

While the electrochemical nanodevice, as shown in FIG. 3, is nominally restricted to use of electrolytes in solid, gel or polymer form, the two-terminal electrochemical nanodevice, as shown in FIG. 9a, is compatible with liquid electrolytes. Either aqueous or organic, liquid electrolytes are by far the most common in battery and supercapacitor systems. In this case, current collecting layers and electrochemical materials together form electrodes at each end of AAO nanopores, with a separation region 150 between them where no material is deposited on top of the insulating sidewall of the AAO nanopore. The energy storage device, as shown in FIG. 9b, includes a cell 160 composed of a nanodevice array that includes a plurality of two-terminal electrochemical nanodevices, as shown in FIG. 9a, configured as a top cell electrode 170 and a bottom cell electrode 180. The energy storage device further includes a top wiring contact 190 and a bottom wiring contact 200.

In accordance with an embodiment of the invention, this structure is formed using ALD for its ability to deposit into high aspect ratio nanopores, while limiting penetration by judicious choice of precursor dose per cycle, as stated above. A representative process sequence to fabricate the electrochemical nanodevice array shown in FIGS. 9a and 9b is as follows. First, a top contact wiring pattern is formed on top of the AAO membrane to provide structural rigidity for the membrane. Then ALD is used to deposit a current collecting layer part way into the top of the nanopores, followed by ALD and/or ECD to deposit the electrochemically active charge storage material (e.g., metal oxide) over the current collecting layer. This forms a top nanoelectrode array. The underlying aluminum and AAO material on the bottom side are then patterned and etched to expose the bottom of the nanopores in a patterned region. A bottom nanoelectrode array is then formed from the exposed bottom opening of the nanopores, using ALD and/or ECD as for the top nanoelectrodes. With each nanopore in the active region now containing a top and bottom nanoelectrode separated by a distance that is a fraction of the nanopore length, the entire structure is immersed in liquid electrolyte, thus activating its function as an electrochemical energy storage device.

The two-terminal nanodevices, as discussed above reflect both energy storage and capture. According to embodiments of the invention, the nanodevices, as discussed above, can be combined to form multilayer nanodevice arrays vertically stacked or horizontally located. Hybrid systems capable of both storage and capture are highly desirable for applications of renewable sources (e.g., storing solar energy captured during daytime for use at night), as well as for other hybrid energy systems (e.g., high power supercapacitors and high energy batteries). In such cases, power management is essential and best integrated on the same nanodevice technology platform. The nanodevices discussed above can serve as power management components as well. Conducting nanowires can be circuit connections (or in proper geometry as inductors), electrostatic capacitors can serve as storage elements, pn junctions can perform as diodes, and Schottky barrier junctions as Schottky or ohmic contacts. The solar cell nanodevices can also function as light detectors or light emitting diodes for optoelectronic functionality.

Figure 10:
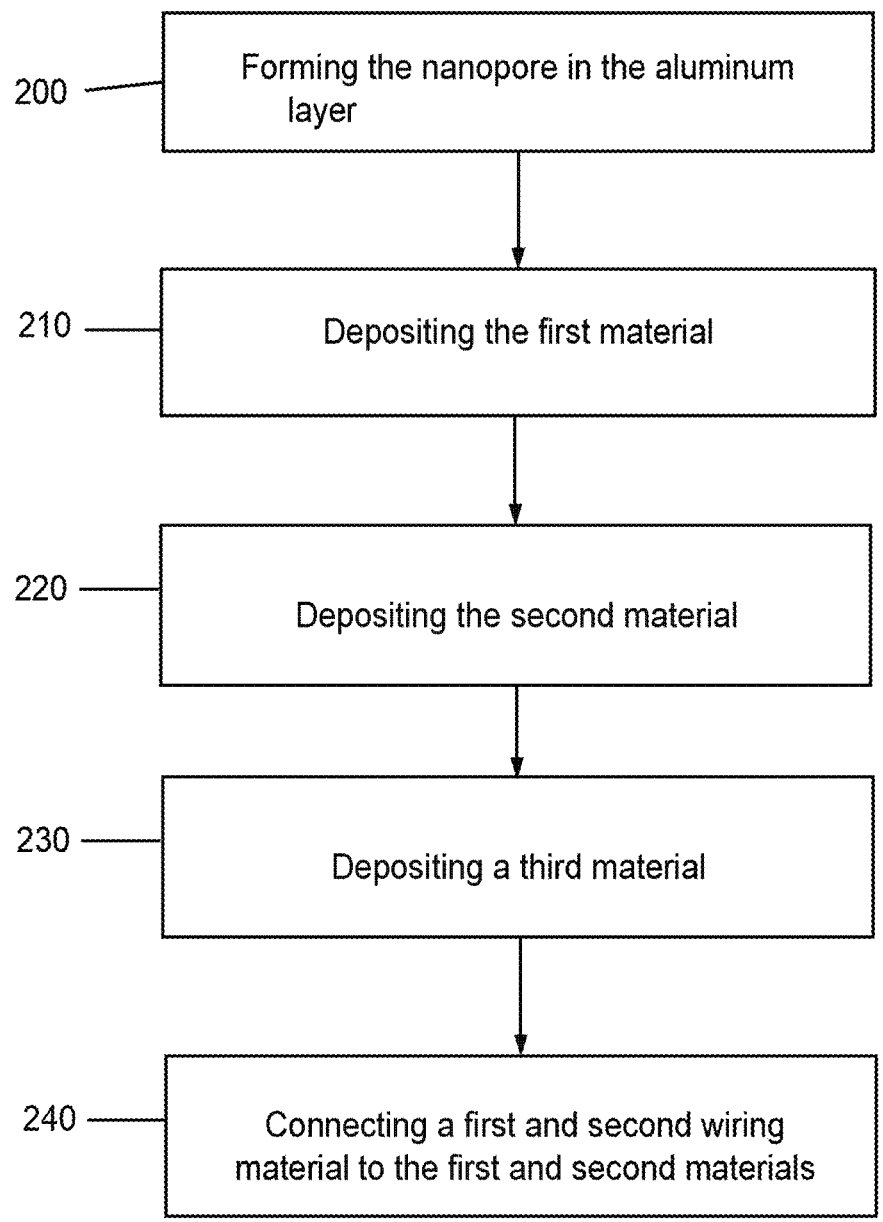
FIG. 10 shows a method for creating a vertical two-terminal nanodevice, in accordance with an embodiment of the invention.

FIG. 10 shows a series of steps for a process for creating a vertical two-terminal nanotube device, in accordance with an embodiment of the invention.

As discussed above, an ordered array of nanopores 10 in an aluminum layer can be formed using the process shown in FIGS. 1c-1e (step 200). According to an embodiment of the invention, as shown in FIG. 10, a first material 20 is deposited into an AAO nanopore 10 using a sequence of ALD deposition steps. The first material 20 is deposited into a first distal end of the nanopore 10, so that it extends toward a second distal end of the nanopore 10 along inner walls of the nanopore 10 (step 210). A second material 30 is deposited into the first distal end of the nanopore 10, so that it extends toward the second distal end of the nanopore 10 within the first material 20 (step 220).

The method includes depositing a third material into the first distal end of the nanopore 10, so that it extends toward the second distal end of the nanopore 10 between the first material 20 and the second material 30 (step 230). As will be understood by a person of ordinary skill in the relevant art, the third material is deposited during the sequential deposit of the first and second material, so that the first material is deposited, followed by the third material and then the second material. In accordance with some embodiments, the third material may include one of an electrical insulator and an electrolyte. Whereas, in other embodiments, the third material may not be needed, for example, in the case where a plurality of sequentially formed layers are deposited to form the nanodevice.

The method includes disposing and connecting a first wiring material 50 to an exposed end of the first material 20, and disposing and connecting a second wiring material 60 to an exposed end of the second material 30 (step 240). The first wiring material 50 and the second wiring material may both be connected on a top surface of the nanopore 10, or may be connected on a top surface and a bottom surface of the nanopore 10, respectively. The method of connecting the first wiring material 50 and the second wiring material 60 may include connecting a plurality of nanopores 10 in parallel.

Either the first or second materials 20, 30 can be replaced with two or more materials to achieve different device behavior and performance. For example, different materials can be used to create the electrostatic capacitor nanodevice, shown in FIG. 2, and different materials can be used to create the electrochemical nanodevice, shown in FIG. 3.

While high conformality and control of ALD makes it attractive for forming first and second materials 20, 30 in the AAO nanopores 10, other processes, such as ECD, CVD, and sol-gel processes can be useful for some of the process steps to introduce materials into the nanopores 10.

The choice of materials and deposition processes can depend significantly on the device type to be created. For the two-terminal nanotube capacitor nanodevice, as shown in FIG. 2, ALD is a preferred deposition process for introducing the first and second materials 20, 30, in order to achieve uniform deposition within the nanopore 10. Whereas, a conventional physical vapor deposition (e.g., evaporation or sputtering) may be a preferred process to deposit the first and second wiring materials 50, 60, to electrically connect a massive array of nanodevices For the electrochemical nanodevice, as shown in FIG. 3, ECD may be a preferred process to deposit the first material 20 if a current collecting layer is already in place and can be contacted to define its voltage during ECD of the first material 20, as a bottom electrode. If inorganic, the electrolyte layer 42, as shown in FIG. 3, may be deposited by sol-gel processes and by ALD. ALD processes are also known for some polymer systems that could include a polymer electrolyte.

Various electron donor and acceptor materials can be chosen for the first and second semiconductor materials 20, 30. Either donor or acceptor material, or n-type or p-type semiconductor material, can be chosen as the first material, to be deposited by ALD as a first material in a first distal end of each nanopore. Semiconducting materials can be, for example, zinc oxide (ZnO) (either n-type or p-type), titanium oxide ($TiO_2$) (n-type), copper oxide-nickel oxide ($Cu_2O$—NiO) (p-type), and vanadium oxide ($V_2O_5$).

It is to be understood that in an embodiment of the present invention, the steps are performed in the sequence and manner as shown although the order of some steps and the like can be changed without departing from the spirit and scope of the present invention. In addition, the process sequence described in FIG. 10 can be repeated as many times as needed. Variations of the process sequence described in FIG. 10 can also use different materials and processes.

Certain embodiments may relate to devices such as batteries. For example, all-in-one nanopore batteries are examples of certain embodiments. These embodiments may also include a variety of alternative configurations, consistent with nanotubular electrodes and nanopore encasement. More generally, in certain embodiments a vertical nanotube device can include a columnar pore disposed in a template material extending as a column from a first side of the template material to a second side of the template material. The vertical nanotube device can include at least one material formed as a nanotube or nanowire within the columnar pore. The vertical nanotube device can be perpendicular or substantially perpendicular to a substrate of the vertical nanotube device.

These various materials within the column may be nanotubes or nanowires and may be variously segmented and variously layered within one another, within the column. Some of these embodiments are described below, as non-limiting examples.

In a first example, the at least one material can include a first material disposed inside the column. The at least one material can also include a second material disposed inside the column. A first segment of the first material can extend into a first distal end of the column along inner walls of the column from one side of the template and a second segment of the first material can extend into a second distal end of the column along the inner walls of the column from the other side of the template. The first segment of the first material can be discontinuous from the second segment of the first material. A first segment of the second material can extend into the first distal end of the column inside the first segment of the first material and a second segment of the second material can extend into the second distal end of the column inside the second segment of the first material. The first segment of the second material can be discontinuous from the second segment of the second material. The first segment of the first material may be longer than, shorter than, or the same length as the first segment of the second material. Similarly, the second segment of the first material can be longer than, shorter than, or the same length as the second segment of the second material.

In a second example, there can be a first material disposed inside the column, a second material disposed inside the column, and a third material disposed inside the column. The first material can extend into a first distal end of the column along inner walls of the column from one side of the template and the second material can extend into a second distal end of the column along the inner walls of the column from the other side of the template. The first material can be discontinuous from the second material. A first segment of the third material can extend into the first distal end of the column inside the first material and a second segment of the third material can extend into the second distal end of the column inside the second material. The first segment of the third material can be discontinuous from the second segment of the third material. The first material can be different from the second material. The various lengths of the segments can be as described in the first example.

In a third example, there can again be a first, second, and third material inside the column. A first segment of the first material can extend into a first distal end of the column along inner walls of the column from one side of the template and a second segment of the first material can extend into a second distal end of the column along the inner walls of the column from the other side of the template. The first segment can be discontinuous from the second segment. A second material can extend into the first distal end of the column inside the first segment of the first material and a third material can extend into the second distal end of the column inside the second segment of the first material. The second material can be different from the third material. As with the previous examples, the lengths of the various segments can vary. Such an arrangement may be seen, for example, in FIG. 11.

Figure 11:
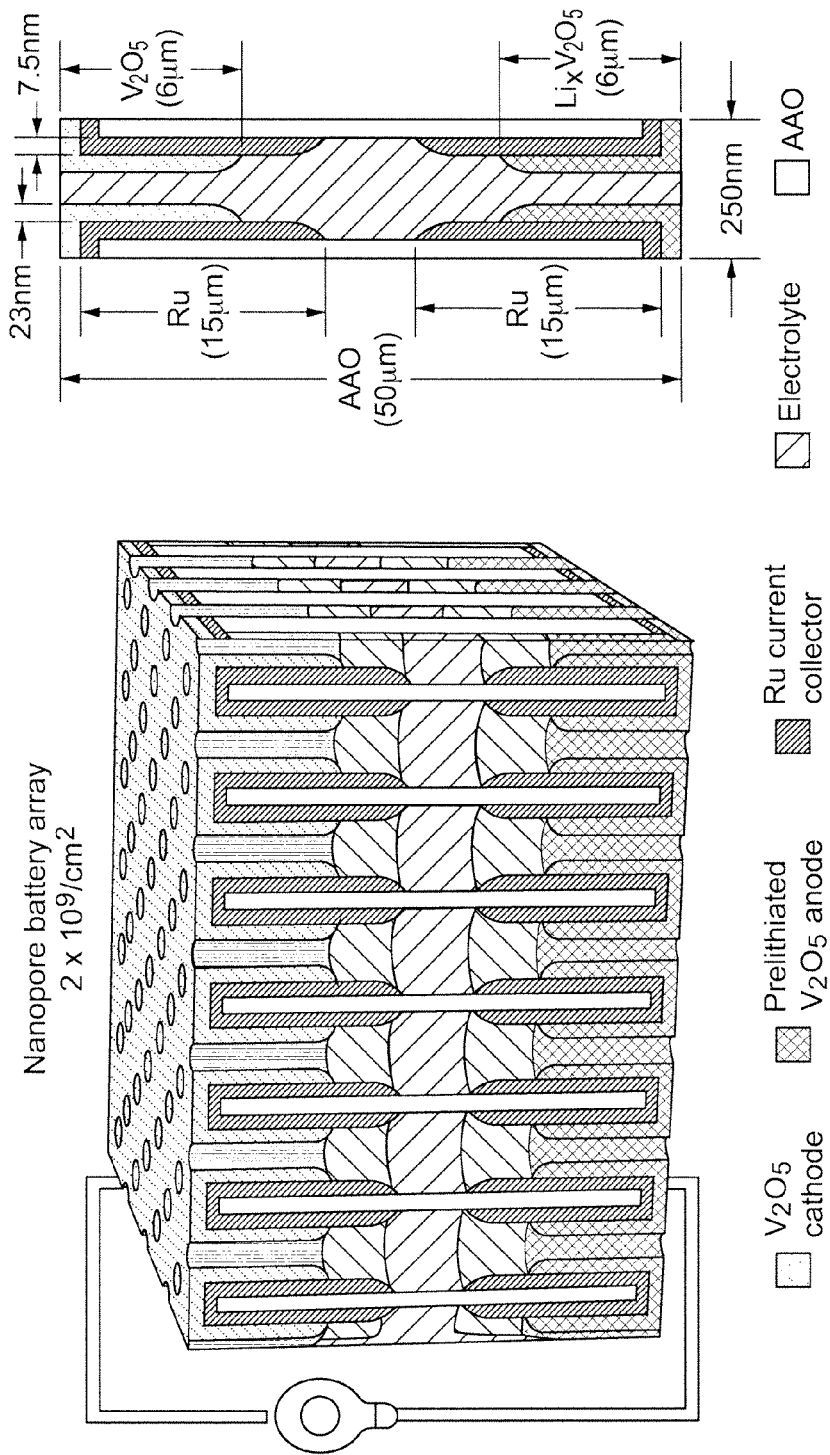
FIG. 11 illustrates a nanopore battery array and battery according to certain embodiments of the invention.

FIG. 11 illustrates a nanopore battery array and battery according to certain embodiments of the invention. As shown in FIG. 11, a nanopore battery array may include a $V_2O_5$ cathode, a prelithiated $V_2O_5$ anode, a Ru current collector, electrolyte, and AAO as a template. These materials and the dimensions shown are merely examples. The dimensions may be varied significantly, if desired. An electric circuit can be connected from one side of the array to the other array, for example to power a light emitting device. Other loads are also permitted.

In a fourth example, the at least one material can include a first material disposed inside the column, a second material disposed inside the column, a third material disposed inside the column, and a fourth material disposed inside the column. The first material can extend into a first distal end of the column along inner walls of the column from one side of the template and the second material can extend into a second distal end of the column along the inner walls of the column from the other side of the template. The first material can be discontinuous from the second material. The third material can extend into the first distal end of the column inside the first material and the fourth material can extend into the second distal end of the column inside the second material. The third material can be discontinuous from the fourth material. The first material, the second material, the third material, and the fourth material can each different from one another. Various other embodiments are also possible in which two or more of the materials are the same as one another, or in which further layers of materials are provided within the column. As mentioned in the preceding examples, various lengths of the segments and materials can be provided.

In the above examples or other embodiments, the template material can include pores in at least one of a metal oxide material, polymer, carbon, metal nitride material, silicon, silicon oxide, or mica. Other template materials are also permitted, if they can form or be etched with suitable pores.

The device can also include a first wiring contact at a first distal end of the vertical nanotube device and a second wiring contact at a second distal end of the vertical nanotube device. This wiring can permit the loading shown in FIG. 11, although other ways of connecting devices are also permitted.

The device can also include electrolyte disposed within the column inside the at least one material. This is illustrated in FIG. 11. Other embodiments are also permitted.

The at least one material can be formed in a discontinuous pattern having a separation region between at least one first segment of the at least one material and at least one second segment of the at least one material. The electrolyte can be disposed at least within the separation region. This is shown in FIG. 11, in which a separation region of about 20 microns (illustration is not to scale and all lengths are approximate) is provided and is provided with electrolyte.

The electrolyte can be a liquid electrolyte, a gel electrolyte, or a solid electrolyte. For example, a nano-wire of electrolyte can be provided in the center of a column. A gel electrolyte may be a polymer gel or an inorganic gel. A solid electrolyte may, for example, be LiPON, lithium oxide, lithium aluminate, lithium aluminum phosphate, garnet, or any combination thereof.

The device can also include first and second current collectors configured to contain the electrolyte within the column. In other embodiments, only a single side of the column may be closed, or both ends may be open. Thus, in certain embodiments, at least one end of the column can be closed.

The vertical nanotube device can be tapered from a first diameter at a first distal end of the column to a second diameter at a second distal end of the column. The tapering can be monotonic or can include multiple increases or decreases in diameter. For example, the vertical nanotube device can include a plurality of diameters and materials along a length of the column.

In certain embodiments, a silicon, lithium, magnesium, sodium or aluminum anode is provided at an end of the vertical nanotube device. Other anode materials, such as other metals, conductors, superconductors, or semiconductors, can be provided.

Figure 12:
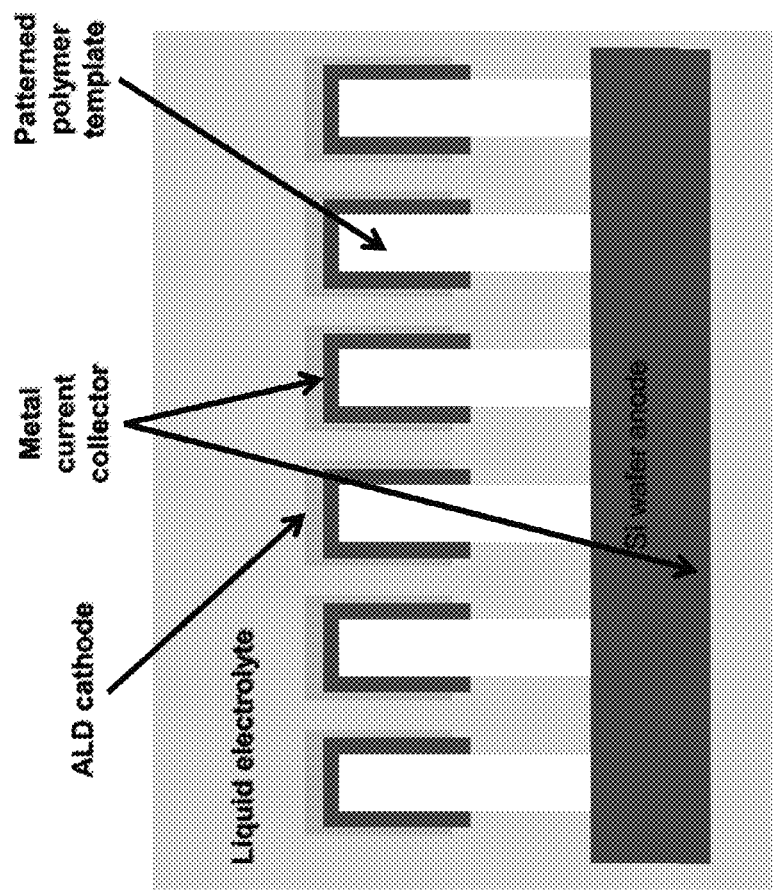
FIG. 12 illustrates a vertical nanotube device, according to certain embodiments of the invention.

FIG. 12 illustrates a vertical nanotube device, according to certain embodiments of the invention. The device can include a nanotube column disposed in a template material extending from a first side of the template material to a second side of the template material. In this case, the template material is illustrated as a patterned polymer template. The device can include a first material disposed inside the column, a second material disposed inside the column, and electrolyte disposed within the column. The first material can extend into a first distal end of the column along inner walls of the column. The second material can extend into the first distal end of the column inside the first material. In this illustration, the first material can be a metal current collector. The second material can be an atomic layer deposited (ALD) cathode. The vertical nanotube device can be perpendicular or substantially perpendicular to a substrate of the vertical nanotube device.

The electrolyte can be, as shown in FIG. 12, disposed within the column inside the second material.

The device can also include a semiconductor wafer anode (as shown in FIG. 12), a lithium anode, or a metal anode provided at a second distal end of the column Additionally, as shown in FIG. 12, a metal current conductor can be disposed on a first face of the silicon wafer anode with the column on a second face of the silicon wafer anode. The first face can be different from the second face.

In certain embodiments, silicon can be deposited at or within a second distal end of the column Other embodiments are also possible.

The above-described nanotube devices can also be constructed as microtube devices. For example, a vertical microtube device can include a microtube column disposed in a template material extending from a first side of the template material to a second side of the template material. The device can also include a first material disposed inside the column, a second material disposed inside the column, and a third material disposed between the first material and the second material. A first segment of the first material can extend into the first distal end of the column along inner walls of the column and a second segment of the first material can extend into the second distal end of the column along the inner walls of the column. The first segment of the first material can be discontinuous from the second segment of the first material. A first segment of the second material can extend into the first distal end of the column inside the first segment of the first material and a second segment of the second material can extend into the second distal end of the column inside the second segment of the first material. The first segment of the second material can be discontinuous from the second segment of the second material. Furthermore, the vertical microtube device can be perpendicular or substantially perpendicular to a substrate of the vertical microtube device.

The template material can include pores in at least one of an metal oxide material, polymer, carbon, metal nitride material, silicon, silicon oxide, or mica. Other template materials are also permitted.

The device can also include electrolyte disposed within the column inside the second material and in a separation region between the first segment of the second material and the second segment of the second material. Other modifications are also permitted.

FIG. 12 may illustrate a 2-layer electrode, which may be constructed with storage and current collector at one end and then provided with electrolyte. A filled other-end or a counterelectrode can be provided outside of the template/pore, or against the template/pore. Furthermore, the electrode structure can be one or more material layers in nanotube configuration.

Besides the anodic aluminum oxide nanopore templates, which are perpendicular or substantially perpendicular, there are a class of nanoporous materials, such as porous Si or polymer membranes, that have pore configurations which are somewhat random, but with pores that can serve as connecting channels or columns between the two sides. These pores, or a subset of these pores can be used in certain embodiments. Thus, the pore may be deemed to be substantially perpendicular if it traverses the template material from one side to the other. Thus, even a random network of pores in a membrane, some of which connect the two sides, can employ an electrode fabrication and can be used in a device, such as a nanopore battery. This can apply both to the nanotubular electrodes at both ends and to the configuration at just one end.

The many features of the invention are apparent from the detailed specification and, thus, it is intended by the appended claims to cover all such features of the invention which fall within the true spirit and scope of the invention. Further, since numerous modifications and changes will readily occur to a person of ordinary skill in the relevant art, it is not desired to limit the invention to the exact construction and operation illustrated and described, and accordingly all suitable modifications and equivalents can be resorted to, falling within the scope of the invention.

For example, certain embodiments describe two materials inside a nanopore. However, some ion storage materials can be good electron conductors, and so can serve the purpose of the first material and the second material. Thus, there may be only one material at one or both ends of the nanopore. Additionally, a very thin material like $Al_2O_3$ can be overlaid on the ion storage material. This thin material can improve charge/discharge cycling performance. This layer may be in addition to the first and second materials described above. Thus, there can be three layers of material at a nanotubular electrode at one/each end of the nanopore. The electrolyte may then be within the third material as a liquid filling the column or as a nanowire, or the like.

We claim:

1. A vertical nanotube device, comprising:
   a columnar pore disposed in a template material extending as a column all the way from a first side of the template material to a second side of the template material;
   at least one material formed as a nanotube or nanowire within the columnar pore,
   wherein the vertical nanotube device is perpendicular or substantially perpendicular to a substrate of the vertical nanotube device.

2. The vertical nanotube device of claim 1, further comprising:
   electrolyte disposed within the column inside the at least one material.

3. The vertical nanotube device of claim 2, wherein the at least one material is formed in a discontinuous pattern having a separation region between at least one first segment of the at least one material and at least one second segment of the at least one material, wherein the electrolyte is disposed at least within the separation region.

4. The vertical nanotube device of claim 2, wherein the electrolyte comprises a liquid electrolyte.

5. The vertical nanotube device of claim 2, wherein the electrolyte comprises a gel electrolyte.

6. The vertical nanotube device of claim 2, wherein the electrolyte comprises a solid electrolyte.

7. The vertical nanotube device of claim 2, further comprising:
   first and second current collectors configured to contain the electrolyte within the column.

* * * * *